United States Patent
Higginson et al.

(10) Patent No.: US 11,157,664 B2
(45) Date of Patent: Oct. 26, 2021

(54) DATABASE MODELING AND ANALYSIS

(71) Applicant: ORACLE INTERNATIONAL CORPORATION, Redwood Shores, CA (US)

(72) Inventors: Antony Higginson, Widnes (GB); John Masterson, Navan (IE); Sean Fitzpatrick, Brittas Bay (IE); Peter Robertshaw, London (GB); Clive Bostock, Pickering (GB); Nick Balch, High Wycombe (GB); Florin Popescu, Bucharest (RO)

(73) Assignee: Oracle International Corporation, Redwood Shores, CA (US)

( * ) Notice: Subject to any disclaimer, the term of this patent is extended or adjusted under 35 U.S.C. 154(b) by 728 days.

(21) Appl. No.: 13/937,885

(22) Filed: Jul. 9, 2013

(65) Prior Publication Data
US 2015/0019197 A1    Jan. 15, 2015

(51) Int. Cl.
*G06F 30/20*        (2020.01)
*G06F 16/21*        (2019.01)

(52) U.S. Cl.
CPC .......... *G06F 30/20* (2020.01); *G06F 16/214* (2019.01)

(58) Field of Classification Search
CPC .......... G06F 11/3447; G06F 11/3442; G06F 11/324; G06F 2201/815; G06F 17/303;
(Continued)

(56) References Cited

U.S. PATENT DOCUMENTS 6,016,394 A    1/2000    Walker
6,185,625 B1   2/2001    Tso et al.
(Continued)

FOREIGN PATENT DOCUMENTS

CN    1545674       11/2004
CN    1652087 A      8/2005
(Continued)

OTHER PUBLICATIONS

To et al, Best Practices for Database Consolidation on Exadata Database Machine, Oracle White Paper, Oracle, 2011, 29 pages.*
(Continued)

*Primary Examiner* — Omar F Fernandez Rivas
*Assistant Examiner* — Robert S Brock
(74) *Attorney, Agent, or Firm* — Kilpatrick Townsend & Stockton LLP

(57) ABSTRACT

A method of modeling a prospective database migration between database systems may include collecting performance data associated with a plurality databases in a first database system. The method may also include receiving a selection of a set of databases in the plurality of databases to migrate to a second database system. The method may additionally include computing, using at least some of the performance data, combined performance data that estimates how the set of databases will perform on the second database system. The method may further include providing one or more indications as to whether the set of databases should be migrated to the second database system. In some embodiments, the one or more indications may be based on the combined performance data.

19 Claims, 16 Drawing Sheets

(58) Field of Classification Search
CPC .......... G06F 9/5008; G06F 2206/1012; G06F 3/0647; G06F 9/50; G06F 9/505
See application file for complete search history.

(56) References Cited

U.S. PATENT DOCUMENTS

| | | |
|---|---|---|
| 6,477,483 B1 * | 11/2002 | Scarlat ................ G06F 11/3414 |
| | | 702/186 |
| 6,604,110 B1 | 8/2003 | Savage et al. |
| 6,615,220 B1 * | 9/2003 | Austin .............. G06F 17/30569 |
| 6,738,811 B1 | 5/2004 | Liang |
| 6,889,210 B1 * | 5/2005 | Vainstein ............ G06F 21/6209 |
| | | 380/201 |
| 6,973,489 B1 | 12/2005 | Levy |
| 7,065,541 B2 | 6/2006 | Gupta et al. |
| 7,177,866 B2 | 2/2007 | Holenstein et al. |
| 7,290,003 B1 | 10/2007 | Tong |
| 7,343,467 B2 | 3/2008 | Brown et al. |
| 7,548,898 B1 | 6/2009 | Tarenskeen et al. |
| 7,580,862 B1 | 8/2009 | Montelo et al. |
| 7,620,665 B1 | 11/2009 | George et al. |
| 7,693,983 B1 * | 4/2010 | Gupta ................. H04L 12/1471 |
| | | 709/221 |
| 7,865,584 B2 | 1/2011 | Grossner et al. |
| 7,886,028 B2 | 2/2011 | Kogoh |
| 7,913,056 B2 | 3/2011 | Brown et al. |
| 8,059,565 B2 | 11/2011 | Dholakla et al. |
| 8,074,107 B2 | 12/2011 | Sivasubramanian et al. |
| 8,150,811 B1 | 4/2012 | Tarenskeen et al. |
| 8,175,863 B1 | 5/2012 | Ostermeyer et al. |
| 8,271,757 B1 | 9/2012 | Chatterjee et al. |
| 8,356,010 B2 | 1/2013 | Driesen |
| 8,484,355 B1 | 7/2013 | Lochhead et al. |
| 8,584,230 B2 | 11/2013 | Dillaway et al. |
| 8,606,894 B1 * | 12/2013 | Fremont ............... G06F 9/5061 |
| | | 709/223 |
| 8,639,989 B1 | 1/2014 | Sorenson, III et al. |
| 8,924,353 B1 | 12/2014 | Patwardhan et al. |
| 8,943,032 B1 | 1/2015 | Xu et al. |
| 9,098,364 B2 | 8/2015 | Davis |
| 9,176,773 B2 | 11/2015 | Fries et al. |
| 9,401,904 B1 | 7/2016 | Hankins et al. |
| 9,442,983 B2 | 9/2016 | Higginson et al. |
| 9,479,394 B2 | 10/2016 | Lochhead et al. |
| 9,491,072 B2 | 11/2016 | Raghunathan et al. |
| 9,602,599 B2 | 3/2017 | Bhattacharya et al. |
| 9,626,710 B1 | 4/2017 | Chheda et al. |
| 9,736,013 B2 | 8/2017 | Markley et al. |
| 9,747,311 B2 | 8/2017 | Buehne et al. |
| 9,762,461 B2 | 9/2017 | Raghunathan et al. |
| 9,792,321 B2 | 10/2017 | Buehne et al. |
| 9,805,070 B2 | 10/2017 | Buehne et al. |
| 9,811,527 B1 * | 11/2017 | Esposito .............. G06F 16/119 |
| 9,967,154 B2 | 5/2018 | Masterson et al. |
| 9,996,562 B2 | 6/2018 | Higginson et al. |
| 10,007,701 B2 | 6/2018 | Subramanian et al. |
| 10,198,255 B2 | 2/2019 | Higginson et al. |
| 10,248,671 B2 | 4/2019 | Buehne et al. |
| 10,540,335 B2 | 1/2020 | Buehne et al. |
| 10,691,654 B2 | 6/2020 | Higginson et al. |
| 2001/0029502 A1 * | 10/2001 | Oeda ................ G06F 17/30578 |
| 2001/0044795 A1 | 11/2001 | Cohen et al. |
| 2002/0002578 A1 | 1/2002 | Yamashita |
| 2002/0019826 A1 | 2/2002 | Tan |
| 2002/0147645 A1 | 10/2002 | Alao et al. |
| 2002/0177977 A1 | 11/2002 | Scarlat et al. |
| 2002/0194329 A1 | 12/2002 | Alling |
| 2002/0198984 A1 | 12/2002 | Goldstein et al. |
| 2003/0037034 A1 | 2/2003 | Daniels et al. |
| 2003/0066049 A1 | 4/2003 | Atwood et al. |
| 2003/0069903 A1 | 4/2003 | Gupta et al. |
| 2003/0192028 A1 | 10/2003 | Gusler et al. |
| 2004/0098425 A1 | 5/2004 | Wiss et al. |
| 2004/0153358 A1 | 8/2004 | Lienhart |
| 2004/0167840 A1 | 8/2004 | Tully et al. |
| 2004/0178261 A1 | 9/2004 | Potonniee et al. |
| 2004/0181790 A1 | 9/2004 | Herrick |
| 2004/0260875 A1 | 12/2004 | Murotani et al. |
| 2005/0021567 A1 | 1/2005 | Holenstein et al. |
| 2005/0055357 A1 | 3/2005 | Campbell |
| 2005/0055446 A1 | 3/2005 | Chidambaran et al. |
| 2005/0102318 A1 | 5/2005 | Odhner et al. |
| 2005/0204241 A1 | 9/2005 | Tamakoshi |
| 2006/0059253 A1 | 3/2006 | Goodman et al. |
| 2006/0112247 A1 * | 5/2006 | Ramany ................ G06F 3/0605 |
| | | 711/165 |
| 2006/0156086 A1 | 7/2006 | Flynn et al. |
| 2006/0173875 A1 * | 8/2006 | Stefaniak ............ H04L 67/1008 |
| 2006/0179171 A1 * | 8/2006 | Stefaniak .............. G06F 9/5061 |
| | | 710/15 |
| 2006/0179431 A1 * | 8/2006 | Devanathan ............... G06F 8/61 |
| | | 717/168 |
| 2006/0235899 A1 | 10/2006 | Tucker |
| 2006/0282825 A1 * | 12/2006 | Taylor .................. G06F 9/5083 |
| | | 717/127 |
| 2007/0028234 A1 | 2/2007 | Sero et al. |
| 2007/0067847 A1 | 3/2007 | Wiemer et al. |
| 2007/0089092 A1 | 4/2007 | Schmidt et al. |
| 2007/0106710 A1 | 5/2007 | Haustein et al. |
| 2007/0150488 A1 * | 6/2007 | Barsness ............... G06F 17/303 |
| 2007/0234346 A1 | 10/2007 | Kramer et al. |
| 2007/0239774 A1 | 10/2007 | Bodily et al. |
| 2007/0250829 A1 * | 10/2007 | Hillier .................. H04L 41/022 |
| | | 717/170 |
| 2007/0299892 A1 | 12/2007 | Nakahara |
| 2008/0010233 A1 * | 1/2008 | Sack ................... G06F 21/6227 |
| 2008/0148345 A1 * | 6/2008 | Rubio ..................... G06F 21/31 |
| | | 726/1 |
| 2008/0247320 A1 | 10/2008 | Grah et al. |
| 2008/0313595 A1 | 12/2008 | Boulineau et al. |
| 2009/0012981 A1 | 1/2009 | Kogoh |
| 2009/0048993 A1 * | 2/2009 | Lohrbach ............. G06F 21/6281 |
| | | 706/45 |
| 2009/0070733 A1 | 3/2009 | Huang et al. |
| 2009/0070771 A1 * | 3/2009 | Yuyitung ................ G06Q 10/06 |
| | | 718/105 |
| 2009/0113399 A1 | 4/2009 | Tzoref et al. |
| 2009/0126022 A1 | 5/2009 | Sakaki |
| 2009/0157864 A1 | 6/2009 | Kim |
| 2009/0187413 A1 | 7/2009 | Abels et al. |
| 2009/0210857 A1 | 8/2009 | Martineau |
| 2009/0238078 A1 * | 9/2009 | Robinson ............... G06Q 10/06 |
| | | 370/241 |
| 2009/0276771 A1 * | 11/2009 | Nickolov .............. H04L 67/1014 |
| | | 717/177 |
| 2009/0313311 A1 | 12/2009 | Hoffmann et al. |
| 2010/0005097 A1 * | 1/2010 | Liang ................. G06F 11/3414 |
| | | 707/E17.032 |
| 2010/0049851 A1 | 2/2010 | Garrison et al. |
| 2010/0049934 A1 | 2/2010 | Tomita et al. |
| 2010/0082543 A1 | 4/2010 | Nagarajan |
| 2010/0191884 A1 | 7/2010 | Holenstein et al. |
| 2010/0192156 A1 * | 7/2010 | Hollingsworth ....... G06F 9/5011 |
| | | 718/104 |
| 2010/0198799 A1 | 8/2010 | Krishnan et al. |
| 2010/0262974 A1 | 10/2010 | Uyeda |
| 2011/0022711 A1 | 1/2011 | Cohn |
| 2011/0093436 A1 | 4/2011 | Zha et al. |
| 2011/0107327 A1 * | 5/2011 | Barkie ....................... G06F 8/63 |
| | | 717/176 |
| 2011/0161933 A1 | 6/2011 | Hudson |
| 2011/0173327 A1 * | 7/2011 | Chen ...................... G06F 9/5066 |
| | | 709/226 |
| 2011/0251992 A1 | 10/2011 | Bethlehem et al. |
| 2012/0017112 A1 | 1/2012 | Broda et al. |
| 2012/0041933 A1 | 2/2012 | Driesen |
| 2012/0096134 A1 | 4/2012 | Suit |
| 2012/0102498 A1 | 4/2012 | Subramanya et al. |
| 2012/0150642 A1 | 6/2012 | Kandanala et al. |
| 2012/0158821 A1 | 6/2012 | Barros |
| 2012/0221845 A1 | 8/2012 | Ferris |
| 2012/0254435 A1 * | 10/2012 | Zhaofu ............. G06F 17/30286 |
| | | 709/226 |

(56) References Cited

U.S. PATENT DOCUMENTS

| | | |
|---|---|---|
| 2012/0265726 A1 | 10/2012 | Padmanabhan et al. |
| 2012/0284360 A1 | 11/2012 | Bense et al. |
| 2012/0297016 A1 | 11/2012 | Iyer et al. |
| 2012/0297059 A1 | 11/2012 | Bross |
| 2012/0303739 A1 | 11/2012 | Ferris |
| 2012/0311128 A1 | 12/2012 | Pechanec et al. |
| 2013/0067298 A1 | 3/2013 | Li et al. |
| 2013/0085742 A1 | 4/2013 | Barker et al. |
| 2013/0085989 A1 | 4/2013 | Nayyar et al. |
| 2013/0086130 A1 | 4/2013 | Wang et al. |
| 2013/0097651 A1 | 4/2013 | Rendahl et al. |
| 2013/0152050 A1 | 6/2013 | Chang et al. |
| 2013/0173546 A1 | 7/2013 | Cline et al. |
| 2013/0173547 A1 | 7/2013 | Cline et al. |
| 2013/0211559 A1 | 8/2013 | Lawson et al. |
| 2013/0268643 A1 | 10/2013 | Chang et al. |
| 2013/0268799 A1 | 10/2013 | Mestery et al. |
| 2013/0268800 A1 | 10/2013 | Rangaiah |
| 2013/0283364 A1 | 10/2013 | Chang et al. |
| 2013/0297802 A1 | 11/2013 | Laribi et al. |
| 2013/0311968 A1 | 11/2013 | Sharma |
| 2013/0326028 A1 | 12/2013 | Cox et al. |
| 2013/0339419 A1 | 12/2013 | Emaru |
| 2014/0007216 A1 | 1/2014 | Ahn |
| 2014/0012960 A1 | 1/2014 | Chien et al. |
| 2014/0019212 A1 | 1/2014 | Lieblich |
| 2014/0019961 A1* | 1/2014 | Neuse .................. G06F 9/5088 718/1 |
| 2014/0059559 A1 | 2/2014 | Alatorre et al. |
| 2014/0068071 A1 | 3/2014 | Fremont et al. |
| 2014/0075031 A1 | 3/2014 | Doering et al. |
| 2014/0075033 A1 | 3/2014 | Doering et al. |
| 2014/0089495 A1 | 3/2014 | Akolkar et al. |
| 2014/0089809 A1 | 3/2014 | Levy et al. |
| 2014/0109053 A1 | 4/2014 | Vasudevan et al. |
| 2014/0129690 A1 | 5/2014 | Jaisinghani et al. |
| 2014/0136711 A1 | 5/2014 | Benari et al. |
| 2014/0172782 A1 | 6/2014 | Schuenzel et al. |
| 2014/0195636 A1 | 7/2014 | Karve et al. |
| 2014/0215045 A1 | 7/2014 | Wang et al. |
| 2014/0279890 A1 | 9/2014 | Srinivasan et al. |
| 2014/0337429 A1 | 11/2014 | Asenjo et al. |
| 2014/0344439 A1 | 11/2014 | Kempf et al. |
| 2014/0373011 A1 | 12/2014 | Anderson et al. |
| 2015/0019195 A1 | 1/2015 | Davis |
| 2015/0019478 A1 | 1/2015 | Buehne et al. |
| 2015/0019479 A1 | 1/2015 | Buehne et al. |
| 2015/0019487 A1 | 1/2015 | Buehne et al. |
| 2015/0019488 A1 | 1/2015 | Higginson et al. |
| 2015/0019564 A1 | 1/2015 | Higginson et al. |
| 2015/0019700 A1 | 1/2015 | Masterson et al. |
| 2015/0019706 A1 | 1/2015 | Raghunathan et al. |
| 2015/0019707 A1 | 1/2015 | Raghunathan et al. |
| 2015/0020059 A1 | 1/2015 | Davis |
| 2015/0026153 A1* | 1/2015 | Gupta .................. G06F 16/951 707/711 |
| 2015/0058467 A1 | 2/2015 | Douglas et al. |
| 2015/0096011 A1 | 4/2015 | Watt |
| 2015/0191119 A1 | 7/2015 | Hikita |
| 2015/0264128 A1 | 9/2015 | Huang et al. |
| 2015/0355947 A1 | 12/2015 | Polkovnikov |
| 2015/0358392 A1 | 12/2015 | Ramalingam et al. |
| 2015/0363396 A1* | 12/2015 | Sengupta .............. G06F 16/214 707/609 |
| 2016/0269371 A1 | 9/2016 | Coimbatore |
| 2016/0364229 A1 | 12/2016 | Higginson et al. |
| 2017/0075709 A1 | 3/2017 | Feng et al. |
| 2017/0118244 A1 | 4/2017 | Bai et al. |
| 2017/0278012 A1 | 9/2017 | Prasad et al. |
| 2017/0337193 A1 | 11/2017 | Buehne et al. |
| 2017/0351716 A1 | 12/2017 | Higginson et al. |
| 2018/0060313 A1 | 3/2018 | Buehne et al. |
| 2018/0157653 A1* | 6/2018 | Wadhwa .............. H04L 67/1095 |
| 2018/0285353 A1* | 10/2018 | Ramohalli Gopala Rao ............... G06F 9/45558 |
| 2018/0293233 A1 | 10/2018 | Higginson et al. |
| 2020/0336464 A1* | 10/2020 | Hastings .............. H04L 9/0891 |

FOREIGN PATENT DOCUMENTS

| | | |
|---|---|---|
| CN | 1734421 | 2/2006 |
| CN | 101204042 | 6/2008 |
| CN | 101211312 A | 7/2008 |
| CN | 101266606 A | 9/2008 |
| CN | 101739275 A | 6/2010 |
| CN | 102637143 A | 8/2012 |
| CN | 102662757 | 9/2012 |
| CN | 102982085 A | 3/2013 |
| CN | 103176988 A | 6/2013 |
| CN | 103297492 | 9/2013 |
| CN | 103550290 A | 1/2014 |
| CN | 105308577 A | 2/2016 |
| CN | 105324756 A | 2/2016 |
| CN | 105324769 A | 2/2016 |
| CN | 105359102 A | 2/2016 |
| CN | 105359146 A | 2/2016 |
| CN | 105359147 A | 2/2016 |
| CN | 105393250 A | 3/2016 |
| CN | 105556515 | 5/2016 |
| CN | 105580032 | 5/2016 |
| CN | 102656565 A | 4/2017 |
| CN | 105580032 | 11/2017 |
| CN | 105308577 | 1/2018 |
| CN | 107729252 | 2/2018 |
| CN | 105324756 | 6/2019 |
| CN | 105324769 | 6/2019 |
| CN | 105359146 | 7/2019 |
| CN | 105393250 | 7/2019 |
| CN | 105359147 | 8/2019 |
| EP | 2418591 | 2/2012 |
| EP | 3019958 | 5/2016 |
| EP | 3019961 | 5/2016 |
| EP | 3019962 | 5/2016 |
| EP | 3019975 | 5/2016 |
| EP | 3019976 | 5/2016 |
| EP | 3019979 | 5/2016 |
| EP | 3019980 | 5/2016 |
| EP | 3019981 | 5/2016 |
| EP | 3020010 | 5/2016 |
| EP | 3019961 | 3/2018 |
| EP | 3019976 | 9/2018 |
| EP | 3019962 | 3/2020 |
| GB | 2468742 | 9/2010 |
| JP | 2006277153 | 10/2006 |
| WO | 9952047 | 10/1999 |
| WO | 0153949 | 7/2001 |
| WO | 2010030489 | 3/2010 |
| WO | 2012047757 A1 | 9/2011 |
| WO | 2013072925 A2 | 9/2012 |
| WO | 2014032262 A1 | 3/2014 |
| WO | 2015/005991 | 1/2015 |
| WO | 2015/005994 | 1/2015 |
| WO | 2015/006124 | 1/2015 |
| WO | 2015/006129 | 1/2015 |
| WO | 2015/006132 | 1/2015 |
| WO | 2015/006137 | 1/2015 |
| WO | 2015/006138 | 1/2015 |
| WO | 2015/006308 | 1/2015 |
| WO | 2015/006358 | 1/2015 |
| WO | 2017213803 | 12/2017 |

OTHER PUBLICATIONS

Vengurlekar et al, Best Practices for Database Consolidation in Private Clouds, Oracle White Paper, Oracle, Mar. 2012, 20 pages.*

Siegel, Michael D., and Arnon Seth Rosenthal. "Building flexible, extensible tools for metadatabase integration." (1991). 22 pages (Year: 1991).*

Pernul, Günther, Werner Winiwarter, and A. Min Tjoa. "The entity-relationship model for multilevel security." In International Con-

(56) References Cited

OTHER PUBLICATIONS ference on Conceptual Modeling, pp. 166-177. Springer, Berlin, Heidelberg, 1993 (Year: 1993).*
Chanchary et al., Data Migration: Connecting Databases in the Cloud, ICCIT 2012, Saudi Arabia, retrieved from the Internet: <URL:http://www.chinacloud.cnjupload/2012-03/12033108076850.pdf>, Jun. 28, 2012, pp. 450-455.
Leite et al., Migratool: Towards a Web-Based Spatial Database Migration Tool, IEEE Computer Society, Proceedings of the 16$^{th}$ International Workshop on Database and Expert Systems Applications, Aug. 22, 2005, pp. 480-484.
Tao et al., Intelligent database placement in cloud environment, Web Services (ICWS), 2012 IEEE 19th International Conference, IEEE Computer Society, Jun. 24, 2012, pp. 544-551.
International Application No. PCT/US2014/045226, International Search Report and Written Opinion dated Oct. 30, 2014, 10 pages.
International Application No. PCT/US2014/045240, International Search Report and Written Opinion dated Oct. 21, 2014, 10 pages.
International Application No. PCT/US2014/045289, International Search Report and Written Opinion dated Oct. 15, 2014, 9 pages.
International Application No. PCT/US2014/045721, International Search Report and Written Opinion dated Nov. 4, 2014, 12 pages.
International Application No. PCT/US2014/045804, International Search Report and Written Opinion dated Nov. 17, 2014, 12 pages.
International Application No. PCT/US2014/040486, Written Opinion dated Jun. 17, 2015, 7 pages.
International Application No. PCT/US2014/040692, Written Opinion dated Jul. 16, 2015, 7 pages.
International Preliminary Report on Patentability of PCT/US2014/045247, dated Jan. 21, 2016, all pages.
International Preliminary Report on Patentability of PCT/US2014/045804, dated Jan. 21, 2016, all pages.
International Preliminary Report on Patentability of PCT/US2014/045721, dated Jan. 21, 2016, all pages.
International Preliminary Report on Patentability of PCT/US2014/045282, dated Jan. 21, 2016, all pages.
International Preliminary Report on Patentability of PCT/US2014/045289, dated Jan. 21, 2016, all pages.
International Preliminary Report on Patentability of PCT/US2014/045240, dated Jan. 21, 2016, all pages.
Notification of Transmittal of the International Preliminary Report on Patentability of PCT/US2014/040486, dated Oct. 1, 2015, all pages.
Notification of Transmittal of the International Preliminary Report on Patentability of PCT/US2014/040692, dated Oct. 8, 2015, all pages.
International Preliminary Report on Patentability of PCT/US2014/045226, dated Jan. 21, 2016, all pages.
Baysal, et al., "A Bug You Like: A Framework for Automated Assignment of Bugs", 2009.
Charles, Bug Severity vs. Priority, Quality Intelligence Blog, Retrieved on Aug. 4, 2014, from http://quality-intelligence.blogspot.com/2010/08/bug-severity-vs-priority.html, Aug. 22, 2010, 6 pages.
Das et al., Albatross: Lightweight elasticity in shared storage databases for the cloud using live data migration, 37th International Conference on Very Large Data Bases, Proceedings of the VLDB Endowment, vol. 4, No. 8, Retrieved from the Internet:URL:http://www.cs.ucsb.eduj-sudiptojpapers/albatross.pdf, Aug. 29, 2011, 12 pages.
International Application No. PCT/US2014/040486, International Search Report and Written Opinion dated Sep. 29, 2014, 11 pages.
International Application No. PCT/US2014/040692, International Search Report and Written Opinion dated Oct. 8, 2014, 8 pages.
International Application No. PCT/US2014/045247, International Search Report and Written Opinion dated Sep. 3, 2014, 8 pages.
International Application No. PCT/US2014/045282, International Search Report and Written Opinion dated Sep. 18, 2014, 12 pages.
Chinese Application No. 201480035255.X, Office Action dated Feb. 27, 2017, 11 pages (5 pages for the original document and 6 pages for the English translation).
European Application No. 14745014.2, Office Action dated Jan. 18, 2017, 8 pages.
European Application No. 14745014.2, Notice of Decision to Grant dated Feb. 22, 2018, 2 pages.
Liang et al., Automatic Construction of an Effective Training Set for Prioritizing Static Analysis Warnings, ASE '10 Proceedings of the IEEE/ACM international conference on Automated software engineering, Sep. 20-24, 2010, pp. 93-102.
Miller, How to Score Customer Feedback/Bugs and Stores (for Agile), Configuration Management, May 17, 2013.
Wilton, a look at Real Application Testing from a customer's perspective, Available Online at: http://www.oracle.com/technetwork/oem/gridcontrol/overview/ratcust-perspectives-white-paper-o-132919.pdf, Jan. 1, 2007.
Chinese Application No. CN201480035257.9, Office Action dated Apr. 6, 2017 dated Apr. 6, 2017, 10 pages.
Chinese Application No. CN201480035255.X, Notice of Decision to Grant dated Aug. 29, 2017, 4 pages.
European Application No. 14745014.2, Office Action dated Apr. 5, 2017, 9 pages.
International Application No. PCT/US2017/032620, International Search Report and Written Opinion dated Jul. 28, 2017, 13 pages.
Chinese Application No. 201480035259.8, Office Action dated Nov. 14, 2017, 17 pages (10 pages for the Original document and 7 pages for the English translation).
Büyüközkan, et al. "Group decision making to better respond customer needs in software development", Computers & Industrial Engineering, 48(2005) 447-441.
Laplante, et al. "Pavlov's Bugs: Matching Repair Policies with Rewards", IT Professional, Sep. 2009, 8 pages.
Sharma, et al. "Predicting the Priority of a Reported Bug Using Machine Learning Techniques and Cross Project Validation", IEEE, 12th International Conference on Intelligent Systems Design and Applications, pp. 539-545, Nov. 2012.
U.S. Appl. No. 15/250,522 received a Notice of Allowance dated Aug. 14, 2018, 10 pages.
U.S. Appl. No. 13/938,061 received a Non-Final Office Action dated Aug. 8, 2018, 30 pages.
CN201480035349.7 received an Office Action dated Aug. 3, 2018, 14 pages.
CN201480039073.X received an Office Action dated Jul. 17, 2018, 26 pages.
U.S. Appl. No. 15/175,213, Final Office Action dated Jan. 10, 2019, 33 pages.
U.S. Appl. No. 15/250,522, Corrected Notice of Allowability dated Jan. 11, 2019, 3 pages.
EP14744404 filed Feb. 7, 2014, Examination Report dated Oct. 15, 2018, 5 pages.
Chinese Application No. 201480039070.6, Office Action dated Aug. 6, 2018, 21 pages (9 pages of Original Document and 12 pages of English Translation).
European Application No. 14744404.6, Office Action dated Oct. 15, 2018, 5 pages.
European Application No. 14745029.0, Office Action dated Sep. 18, 2018, 8 pages.
European Application No. 18187354.8, Extended European Search Report dated Sep. 12, 2018, 6 pages.
U.S. Appl. No. 13/937,344, Corrected Notice of Allowability dated Sep. 15, 2016, 2 pages.
U.S. Appl. No. 13/937,344, Final Office Action dated Feb. 11, 2016, 12 pages.
U.S. Appl. No. 13/937,344, Non-Final Office Action dated Sep. 24, 2015, 11 pages.
U.S. Appl. No. 13/937,344, Notice of Allowance dated May 4, 2016, 11 pages.
U.S. Appl. No. 13/937,344, Notice of Allowance dated Oct. 11, 2016, 2 pages.
U.S. Appl. No. 13/937,344, Notice of Allowance dated Jun. 6, 2016, 5 pages.
U.S. Appl. No. 13/937,483, Advisory Action dated May 12, 2016, 3 pages.
U.S. Appl. No. 13/937,483, Final Office Action dated Feb. 26, 2016, 13 pages.

(56) References Cited

OTHER PUBLICATIONS

U.S. Appl. No. 13/937,483, Non-Final Office Action dated Aug. 12, 2016, 13 pages.
U.S. Appl. No. 13/937,483, Non-Final Office Action dated Sep. 25, 2015, 13 pages.
U.S. Appl. No. 13/937,483, Notice of Allowance dated May 3, 2017, 5 pages.
U.S. Appl. No. 13/937,483, Notice of Allowance dated Jan. 20, 2017, 8 pages.
U.S. Appl. No. 13/937,486, Final Office Action dated Jul. 28, 2016, 18 pages.
U.S. Appl. No. 13/937,486, Non-Final Office Action dated Jan. 11, 2016, 14 pages.
U.S. Appl. No. 13/937,486, Non-Final Office Action dated Nov. 4, 2016, 20 pages.
U.S. Appl. No. 13/937,486, Notice of Allowance dated Jun. 16, 2017, 5 pages.
U.S. Appl. No. 13/937,545, Final Office Action dated May 13, 2016, 20 pages.
U.S. Appl. No. 13/937,545, Non-Final Office Action dated Feb. 7, 2017, 19 pages.
U.S. Appl. No. 13/937,545, Non-Final Office Action dated Nov. 10, 2015, 19 pages.
U.S. Appl. No. 13/937,545, Notice of Allowance dated Jun. 15, 2017, 10 pages.
U.S. Appl. No. 13/937,868, Final Office Action dated Apr. 22, 2016, 23 pages.
U.S. Appl. No. 13/937,868, Final Office Action dated Oct. 27, 2017, 25 pages.
U.S. Appl. No. 13/937,868, Non-Final Office Action dated Nov. 4, 2015, 18 pages.
U.S. Appl. No. 13/937,868, Non-Final Office Action dated Apr. 5, 2017, 23 pages.
U.S. Appl. No. 13/937,868, Notice of Allowance dated Feb. 8, 2018, 10 pages.
U.S. Appl. No. 13/937,970, Advisory Action dated Apr. 13, 2017, 3 pages.
U.S. Appl. No. 13/937,970, Final Office Action dated Dec. 10, 2015, 18 pages.
U.S. Appl. No. 13/937,970, Final Office Action dated Dec. 1, 2016, 22 pages.
U.S. Appl. No. 13/937,970, Non-Final Office Action dated May 5, 2015, 17 pages.
U.S. Appl. No. 13/937,970, Non-Final Office Action dated May 12, 2016, 28 pages.
U.S. Appl. No. 13/937,970, Non-Final Office Action dated Jun. 26, 2017, 31 pages.
U.S. Appl. No. 13/937,970, Notice of Allowance dated Dec. 28, 2017, 9 pages.
U.S. Appl. No. 13/937,970, Supplemental Notice of Allowance dated Jan. 19, 2018, 6 pages.
U.S. Appl. No. 13/937,977, Corrected Notice of Allowability dated Jul. 18, 2016, 2 pages.
U.S. Appl. No. 13/937,977, Final Office Action dated Feb. 26, 2015, 30 pages.
U.S. Appl. No. 13/937,977, Non-Final Office Action dated Aug. 12, 2014, 28 pages.
U.S. Appl. No. 13/937,977, Non-Final Office Action dated Aug. 19, 2015, 34 pages.
U.S. Appl. No. 13/937,977, Notice of Allowance dated Mar. 16, 2016, 18 pages.
U.S. Appl. No. 13/937,988, Non-Final Office Action dated Sep. 1, 2016, 10 pages.
U.S. Appl. No. 13/937,988, Notice of Allowance dated Apr. 27, 2017, 8 pages.
U.S. Appl. No. 13/938,061, Advisory Action dated Jul. 26, 2017, 6 pages.
U.S. Appl. No. 13/938,061, Final Office Action dated Mar. 23, 2017, 29 pages.
U.S. Appl. No. 13/938,066, Corrected Notice of Allowability dated Jun. 2, 2015, 2 pages.
U.S. Appl. No. 13/938,066, Non-Final Office Action dated Dec. 17, 2014, 19 pages.
U.S. Appl. No. 13/938,066, Notice of Allowance dated Apr. 29, 2015, 15 pages.
U.S. Appl. No. 15/175,213, Non-Final Office Action dated Jul. 11, 2018, 35 pages.
U.S. Appl. No. 15/250,522, Non-Final Office Action dated Mar. 1, 2018, 15 pages.
U.S. Appl. No. 15/250,522, Notice of Allowance dated Aug. 14, 2018, all pages.
U.S. Appl. No. 15/250,522, Corrected Notice of Allowability dated Sep. 27, 2018, 2 pages.
U.S. Appl. No. 15/789,049, Final Office Action dated Sep. 6, 2018, 6 pages.
U.S. Appl. No. 15/789,049, Non-Final Office Action dated Feb. 2, 2018, 14 pages.
Chinese Application No. 201480039070.6, Office Action dated Aug. 6, 2018, 21 pages.
European Application No. 14736122.4, Notice of Decision to Grant dated Aug. 17, 2018, 2 pages.
CN201480035259.8, Office Action dated Dec. 3, 2018, 15 pages.
CN201480039073.X, Office Action dated Dec. 10, 2018, 6 pages.
CN201480039083.3, Office Action dated Dec. 10, 2018, 6 pages.
EP14745029.0, Office Action dated Sep. 18, 2018, all pages.
PCT/US2017/032620, International Preliminary Report on Patentability dated Dec. 20, 2018, 10 pages.
U.S. Appl. No. 15/670,473, Non-Final Office Action dated Dec. 18, 2018, 12 pages.
U.S. Appl. No. 15/789,049, Notice of Allowance dated Nov. 15, 2018, 5 pages.
CN Application No. 201480035259.8 received and office action dated Jun. 14, 2018, 19 pages.
CN Application No. 201480035250.7 received and office action dated Jul. 5, 2018, 12 pages.
CN Application No. 201480039080.X received and office action dated Jul. 5, 2018, 19 pages.
CN Application No. 201480039083.3 received and office action dated Jul. 10, 2018, 30 pages.
EP Application No. 14745015.9 received an office action dated May 14, 2018, 5 pages.
U.S. Appl. No. 15/175,213 received a Non-Final Office Action dated Jul. 11, 2018, 35 pages.
Chinese Application No. 201480039070.6, Office Action dated Jan. 14, 2019, 25 pages (10 pages of the original document and 15 pages of the English translation).
European Application No. 14745028.2, Office Action dated Feb. 13, 2019, 6 pages.
European Application No. EP17726064.3, Office Action dated Apr. 2, 2020, 9 pages.
Chinese Application No. 201480035349.7, Office Action dated Apr. 10, 2019, 7 pages (3 pages for the original document and 4 pages for the English translation).
Chinese Application No. 201480039070.6, Office Action dated Mar. 26, 2019, 21 pages (9 pages for the original document and 12 pages for the English translation).
Chinese Application No. 201480039070.6, Office Action dated Jul. 24, 2019, 14 pages (9 pages for original document and 5 pages for English translation).
Chinese Application No. 201480035250.7, Notice of Decision to Grant dated Mar. 7, 2019, 2 pages.
Chinese Application No. 201480035259.8, Notice of Decision to Grant dated Apr. 2, 2019, 2 pages.
Chinese Application No. 201480039073.X, Notice of Decision to Grant dated Mar. 26, 2019, 2 pages.
Chinese Application No. 201480039080.X, Notice of Decision to Grant dated May 9, 2019, 2 pages.
Chinese Application No. 201480039083.3, Notice of Decision to Grant dated Apr. 17, 2019, 2 pages.
European Application No. 14745012.6, Office Action dated Mar. 5, 2019, 4 pages.

(56) References Cited

OTHER PUBLICATIONS

European Application No. 14745029.0, Summons to Attend Oral Proceedings mailed on Apr. 25, 2019, 12 pages.
U.S. Appl. No. 13/938,061, Advisory Action dated May 24, 2019, 16 pages.
U.S. Appl. No. 13/938,061, Final Office Action dated Mar. 8, 2019, 25 pages.
U.S. Appl. No. 15/175,213, Advisory Action dated Mar. 21, 2019, 5 pages.
U.S. Appl. No. 15/670,473, Final Office Action dated Jun. 6, 2019, 12 pages.
U.S. Appl. No. 13/938,061, Non-Final Office Action dated Aug. 8, 2016, 29 pages.
EP Application No. 14745013.4 received an office action dated Apr. 30, 3018, 6 pages.
Chinese Application No. 201480039070.6, Office Action dated Jan. 10, 2020, 14 pages (6 pages of Original Document and 8 pages of English Translation).
U.S. Appl. No. 15/175,213, Final Office Action dated Feb. 6, 2020, 30 pages.
Chinese Application No. 201480035349.7, Office Action dated Sep. 4, 2019, 8 pages (3 pages of Original Document and 5 pages of English Translation).
U.S. Appl. No. 15/175,213, Non-Final Office Action dated Sep. 19, 2019, 33 pages.
U.S. Appl. No. 15/670,473, Notice of Allowance dated Sep. 18, 2019, 8 pages.
U.S. Appl. No. 16/003,557, Non-Final Office Action dated Sep. 5, 2019, 9 pages.
Qiu-Yan, et al., "Common Vulnerability Rating Method", Computer Engineering, vol. 34, Issue 19, pp. 133-136, Oct. 2008, English Abstract Submitted.
China Application No. CN201480039070.6 received an Office Action dated Jul. 1, 2020, 14 pages, 11 pages English translation, 3 pages, Chinese Office Action.
China Application No. CN201711101256.1 received an Office Action dated Jun. 3, 2020, 23 pages. 14 pages English translation, 9 pages, Chinese Office Action.
U.S. Appl. No. 15/175,213, Non-Final Office Action dated Sep. 22, 2020, 44 pages.
European Application No. EP14744404.6, Summons to Attend Oral Proceedings mailed on Sep. 15, 2020, 9 pages.

\* cited by examiner

FIG. 12

Next Steps: Review Recommendations and Findings with your Oracle TAM

Recommendations

| Category | Item | Target | Recommendation | Status |
|---|---|---|---|---|
| DB Features | Compression | All | Candidate databases do not have data compression enabled where available. ACS recommends using the online compression features of the Cloud Migration Service. This will increase available storage on the target Oracle Cloud. | Review |
| Disk Projections | Compression | Manhattan Cloud | Enabling compression on your target Cloud will provide a 25% reduction on storage utilization. This benefit can be implemented automatically with the ACS Cloud Migration Service. | Review |

FIG. 16

DATABASE MODELING AND ANALYSIS

CROSS-REFERENCES TO RELATED APPLICATIONS

The present application is related to the following copending and commonly assigned U.S. Patent Applications:

U.S. patent application Ser. No. 13/937,977, filed concurrent herewith by Higginson and entitled "METHOD AND SYSTEM FOR REDUCING INSTABILITY WHEN UPGRADING SOFTWARE;"

U.S. patent application Ser. No. 13/938,061, filed concurrent herewith by Davis and entitled "CONSOLIDATION PLANNING SERVICES FOR SYSTEMS MIGRATION;"

U.S. patent application Ser. No. 13/938,066, filed concurrent herewith by Davis and entitled "MIGRATION SERVICES FOR SYSTEMS;"

U.S. patent application Ser. No. 13/937,545, filed concurrent herewith by Higginson et al. and entitled "AUTOMATED DATABASE MIGRATION ARCHITECTURE;"

U.S. patent application Ser. No. 13/937,344, filed concurrent herewith by Raghunathan et al. and entitled "CLOUD SERVICES LOAD TESTING AND ANALYSIS;"

U.S. patent application Ser. No. 13/937,483, filed concurrent herewith by Raghunathan et al. and entitled "CLOUD SERVICES PERFORMANCE TUNING AND BENCHMARKING;"

U.S. patent application Ser. No. 13/937,988, filed concurrent herewith by Buehne et al. and entitled "SOLUTION TO GENERATE A SCRIPTSET FOR AN AUTOMATED DATABASE MIGRATION;"

U.S. patent application Ser. No. 13/937,545, filed concurrent herewith by Buehne et al. and entitled "ONLINE DATABASE MIGRATION;"

U.S. patent application Ser. No. 13/937,486, filed concurrent herewith by Buehne et al. and entitled "DYNAMIC MIGRATION SCRIPT MANAGEMENT;" and U.S. patent application Ser. No. 13/937,970, filed concurrent herewith by Masterson et al. and entitled "ADVANCED CUSTOMER SUPPORT SERVICES-ADVANCED SUPPORT CLOUD PORTAL,"

of which the entire disclosure of each is incorporated herein by reference for all purposes.

BACKGROUND

Data migration may generally include transferring any type of data from one storage device, format, or system to another storage device, format, or system. Data migration is often required when organizations or individuals upgrade computer systems, merge existing systems, replatform operating systems in which the database resides, or transfer data between locations. Generally, data must be extracted from the old system and loaded onto the new system if the existing database operating system is not compatible with a migration that is acceptable to a business. For example, it may be necessary to move data between databases when switching to a new database vendor or upgrading an existing version of a database. This may include physical data migration and may change the underlying data format.

BRIEF SUMMARY

In one embodiment, a method of modeling a prospective database migration between database systems may be presented. The method may include collecting performance data associated with a plurality databases in a first database system. The method may also include receiving a selection of a set of databases in the plurality of databases to migrate to a second database system. The method may additionally include computing, using at least some of the performance data, combined performance data that estimates how the set of databases will perform on the second database system. The method may further include providing one or more indications as to whether the set of databases should be migrated to the second database system. In some embodiments, the one or more indications may be based on the combined performance data.

In some implementations, one or more of the following features may be present. In some embodiments, the performance data may be collected and stored prior to receiving the selection of the set of databases. The performance data may be collected by a database agent operating on the first database system, and the combined performance data may be computed remotely at a cloud-based service operated by a provider of the second database system. The set of databases may include more than one database, and the more than one database may be migrated to a single database in the second database system. The one or more indications may include a quantitative component that describes whether computing hardware of the second database system can facilitate the set of databases according to a set of technical specifications, and a qualitative component that describes whether the set of databases can operate together on the second database system according to a set of business rules.

In some embodiments, the one or more indications may include a first indication that the average performance of a combination of the set of databases exceeds a threshold, a second indication that a peak performance of the combination of the set of databases exceeds the threshold, and/or a third indication that neither the peak performance and the average performance exceeds a threshold. The one or more indications as to whether the set of databases should be migrated to the second database system may be presented through a portal of a remote cloud service operated by a provider of the second database system. The method may also include translating the performance data from a first schema to a second schema, where the first schema may be used by a relational database manager of the first database system, and the second schema may be used for the prospective database migration.

In some embodiments, the one or more indications may include a combined storage space required by a combination of the set of databases in the second database system. The one or more indications may include a combined processor workload required by a combination of the set of databases in the second database system. The one or more indications may include an indication that a first database in the set of databases is associated with a first security level, an indication that a second database in the set of databases is associated with a second security level, and an indication as to whether the first security level is compatible with the second security level.

In another embodiment, a computer-readable memory may be presented. The computer-readable memory may comprise a sequence of instructions which, when executed by one or more processors, causes the one or more processors to model a prospective database migration between database systems. The instructions may cause the processor(s) to collect performance data associated with a plurality databases in a first database system. The instructions may also cause the processor(s) to receive a selection of a set of databases in the plurality of databases to migrate to a second database system. The instructions may additionally cause the processor(s) to compute, using at least some of the performance data, combined performance data that estimates how the set of databases will perform on the second database system. The instructions may further cause the processor(s) to provide one or more indications as to whether the set of databases should be migrated to the second database system. In some embodiments, the one or more indications may be based on the combined performance data.

In yet another embodiment, a system may be presented. The system may include one or more processors and a memory communicatively coupled with and readable by the one or more processors. The memory may comprise a sequence of instructions which, when executed by the one or more processors, cause the one or more processors to model a prospective database migration between database systems. The instructions may cause the processor(s) to collect performance data associated with a plurality databases in a first database system. The instructions may also cause the processor(s) to receive a selection of a set of databases in the plurality of databases to migrate to a second database system. The instructions may additionally cause the processor(s) to compute, using at least some of the performance data, combined performance data that estimates how the set of databases will perform on the second database system. The instructions may further cause the processor(s) to provide one or more indications as to whether the set of databases should be migrated to the second database system. In some embodiments, the one or more indications may be based on the combined performance data.

BRIEF DESCRIPTION OF THE DRAWINGS

A further understanding of the nature and advantages of the present invention may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

FIG. 12 illustrates an interface for configuration analysis, according to some embodiments.

FIG. 16 illustrates an interface for providing recommendations for a migration scenario, according to some embodiments.

DETAILED DESCRIPTION

Figure 1:
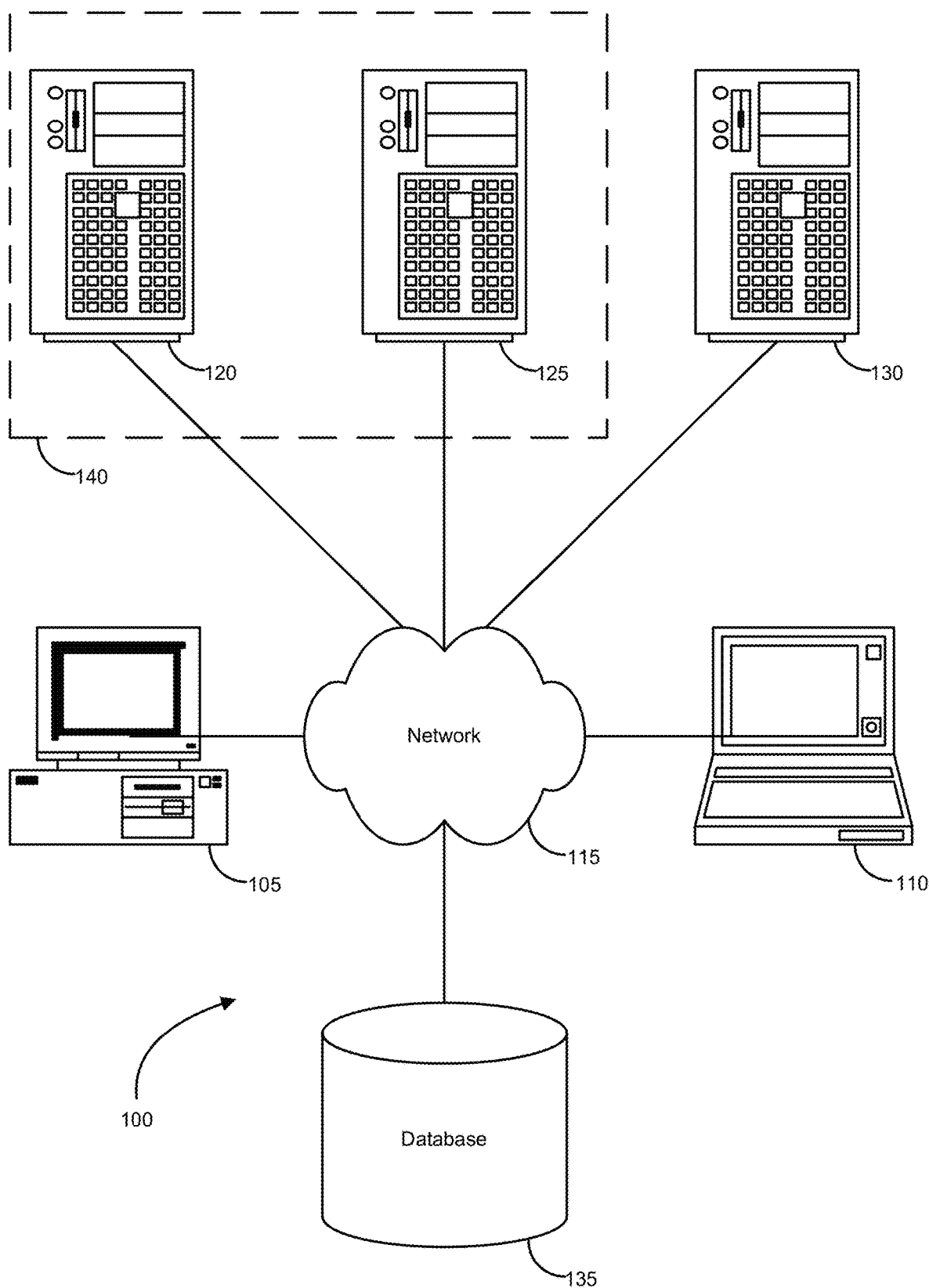
FIG. 1 illustrates a block diagram of components of an exemplary operating environment in which various embodiments of the present invention may be implemented.

In the following description, for the purposes of explanation, numerous specific details are set forth in order to provide a thorough understanding of various embodiments of the present invention. It will be apparent, however, to one skilled in the art that embodiments of the present invention may be practiced without some of these specific details. In other instances, well-known structures and devices are shown in block diagram form.

The ensuing description provides exemplary embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "machine-readable medium" includes, but is not limited to portable or fixed storage devices, optical storage devices, wireless channels and various other mediums capable of storing, containing or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Each of the embodiments disclosed herein may be implemented in a general-purpose computer system. FIG. 1 is a block diagram illustrating components of an exemplary operating environment in which various embodiments of the present invention may be implemented. The system 100 can include one or more user computers 105, 110, which may be used to operate a client, whether a dedicated application, web browser, etc. The user computers 105, 110 can be general purpose personal computers (including, merely by way of example, personal computers and/or laptop computers running various versions of Microsoft Corp.'s Windows and/or Apple Corp.'s Macintosh operating systems) and/or workstation computers running any of a variety of commercially-available UNIX or UNIX-like operating systems (including without limitation, the variety of GNU/Linux operating systems). These user computers 105, 110 may also have any of a variety of applications, including one or more development systems, database client and/or server applications, and web browser applications. Alternatively, the user computers 105, 110 may be any other electronic device, such as a thin-client computer, Internet-enabled mobile telephone, and/or personal digital assistant, capable of communicating via a network (e.g., the network 115 described below) and/or displaying and navigating web pages or other types of electronic documents. Although the exemplary system 100 is shown with two user computers, any number of user computers may be supported.

In some embodiments, the system 100 may also include a network 115. The network may can be any type of network familiar to those skilled in the art that can support data communications using any of a variety of commercially-available protocols, including without limitation TCP/IP, SNA, IPX, AppleTalk, and the like. Merely by way of example, the network 115 may be a local area network ("LAN"), such as an Ethernet network, a Token-Ring network and/or the like; a wide-area network; a virtual network, including without limitation a virtual private network ("VPN"); the Internet; an intranet; an extranet; a public switched telephone network ("PSTN"); an infra-red network; a wireless network (e.g., a network operating under any of the IEEE 802.11 suite of protocols, the Bluetooth protocol known in the art, and/or any other wireless protocol); and/or any combination of these and/or other networks such as GSM, GPRS, EDGE, UMTS, 3 G, 2.5 G, CDMA, CDMA2000, WCDMA, EVDO etc.

The system may also include one or more server computers 120, 125, 130 which can be general purpose computers and/or specialized server computers (including, merely by way of example, PC servers, UNIX servers, mid-range servers, mainframe computers rack-mounted servers, etc.). One or more of the servers (e.g., 130) may be dedicated to running applications, such as a business application, a web server, application server, etc. Such servers may be used to process requests from user computers 105, 110. The applications can also include any number of applications for controlling access to resources of the servers 120, 125, 130.

The web server can be running an operating system including any of those discussed above, as well as any commercially-available server operating systems. The web server can also run any of a variety of server applications and/or mid-tier applications, including HTTP servers, FTP servers, CGI servers, database servers, Java servers, business applications, and the like. The server(s) also may be one or more computers which can be capable of executing programs or scripts in response to the user computers 105, 110. As one example, a server may execute one or more web applications. The web application may be implemented as one or more scripts or programs written in any programming language, such as Java™, C, C# or C++, and/or any scripting language, such as Perl, Python, or TCL, as well as combinations of any programming/scripting languages. The server(s) may also include database servers, including without limitation those commercially available from Oracle®, Microsoft®, Sybase®, IBM® and the like, which can process requests from database clients running on a user computer 105, 110.

In some embodiments, an application server may create web pages dynamically for displaying on an end-user (client) system. The web pages created by the web application server may be forwarded to a user computer 105 via a web server. Similarly, the web server can receive web page requests and/or input data from a user computer and can forward the web page requests and/or input data to an application and/or a database server. Those skilled in the art will recognize that the functions described with respect to various types of servers may be performed by a single server and/or a plurality of specialized servers, depending on implementation-specific needs and parameters.

The system 100 may also include one or more databases 135. The database(s) 135 may reside in a variety of locations. By way of example, a database 135 may reside on a storage medium local to (and/or resident in) one or more of the computers 105, 110, 120, 125, 130. Alternatively, it may be remote from any or all of the computers 105, 110, 120, 125, 130, and/or in communication (e.g., via the network 115) with one or more of these. In a particular set of embodiments, the database 135 may reside in a storage-area network ("SAN") familiar to those skilled in the art. Similarly, any necessary files for performing the functions attributed to the computers 105, 110, 120, 125, 130 may be stored locally on the respective computer and/or remotely, as appropriate. In one set of embodiments, the database 135 may be a relational database, such as Oracle 10 g, that is adapted to store, update, and retrieve data in response to SQL-formatted commands.

Figure 2:
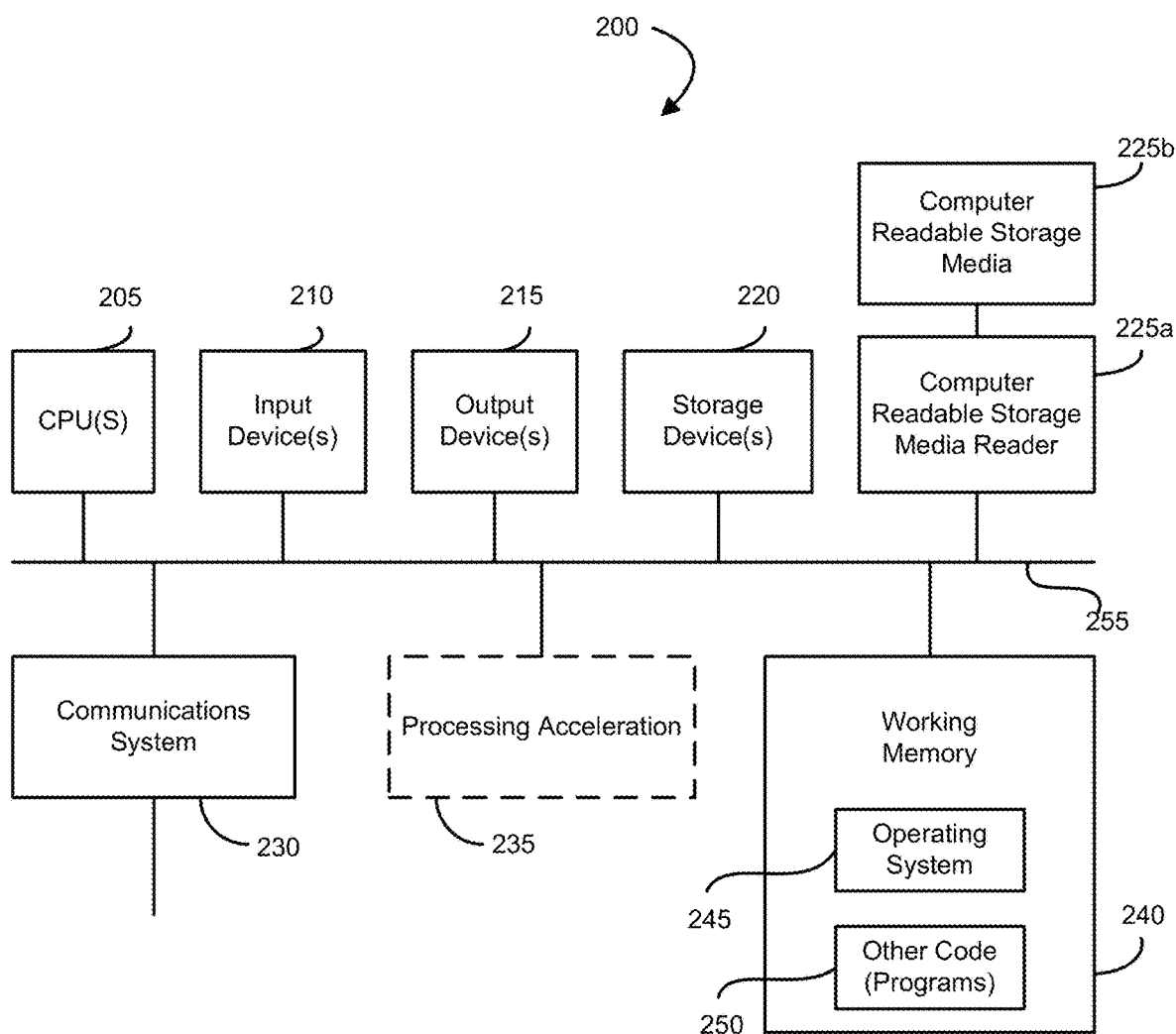
FIG. 2 illustrates a block diagram of an exemplary computer system in which embodiments of the present invention may be implemented.

FIG. 2 illustrates an exemplary computer system 200, in which various embodiments of the present invention may be implemented. The system 200 may be used to implement any of the computer systems described above. The computer system 200 is shown comprising hardware elements that may be electrically coupled via a bus 255. The hardware elements may include one or more central processing units (CPUs) 205, one or more input devices 210 (e.g., a mouse, a keyboard, etc.), and one or more output devices 215 (e.g., a display device, a printer, etc.). The computer system 200 may also include one or more storage device 220. By way of example, storage device(s) 220 may be disk drives, optical storage devices, solid-state storage device such as a random access memory ("RAM") and/or a read-only memory ("ROM"), which can be programmable, flash-updateable and/or the like.

The computer system 200 may additionally include a computer-readable storage media reader 225a, a communications system 230 (e.g., a modem, a network card (wireless or wired), an infra-red communication device, etc.), and working memory 240, which may include RAM and ROM devices as described above. In some embodiments, the computer system 200 may also include a processing acceleration unit 235, which can include a DSP, a special-purpose processor and/or the like.

The computer-readable storage media reader 225a can further be connected to a computer-readable storage medium 225b, together (and, optionally, in combination with storage device(s) 220) comprehensively representing remote, local, fixed, and/or removable storage devices plus storage media for temporarily and/or more permanently containing computer-readable information. The communications system 230 may permit data to be exchanged with the network 220 and/or any other computer described above with respect to the system 200.

The computer system 200 may also comprise software elements, shown as being currently located within a working memory 240, including an operating system 245 and/or other code 250, such as an application program (which may be a client application, web browser, mid-tier application, RDBMS, etc.). It should be appreciated that alternate embodiments of a computer system 200 may have numerous variations from that described above. For example, customized hardware might also be used and/or particular elements might be implemented in hardware, software (including portable software, such as applets), or both. Further, connection to other computing devices such as network input/output devices may be employed. Software of computer system 200 may include code 250 for implementing embodiments of the present invention as described herein.

Each of the methods described herein may be implemented by a computer system, such as computer system 200 in FIG. 2. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed by the computed without human intervention. Therefore, it will be understood in light of this disclosure, that each step and each method described herein may be altered to include an input and output to and from a user, or may be done automatically by a computer system. Furthermore, some embodiments of each of the methods described herein may be implemented as a set of instructions stored on a tangible, non-transitory storage medium to form a tangible software product.

As with nearly all software-based systems, database systems are often required to undergo periodic upgrades in order to take advantage of new computing technologies. During the migration process, a customer may wish to migrate one or more old database systems over to a fewer number of new database systems. Customers often ask the question "if I were to move database A and database B over to this new machine, would it work?" Unfortunately, answering this question requires a great deal of analysis and work. Configuration assessments, performance assessments, and other system evaluations may take as long as 30 days. Customers may have hundreds or even thousands of databases, and thus determining which databases can be migrated to new systems may quickly become a very difficult task.

Embodiments described herein may utilize an existing Enterprise Manager to consistently and/or periodically monitor and model the customers database systems. A Enterprise Manager agent may be employed to collect and monitor modeling data associated with the customer's databases. This information may be uploaded to a cloud service through a gateway that resides on a customer's Enterprise Manager system. The cloud service can then perform calculations and analysis on the data recorded by the agent in order to provide a recommendation for specific migration scenarios, e.g. whether or not database A and database B can be moved to a new system. Additionally, engineers may be provided with other analyses relevant to database migration, such as security considerations, data integrity considerations, data criticality considerations, and/or the like.

Figure 3:
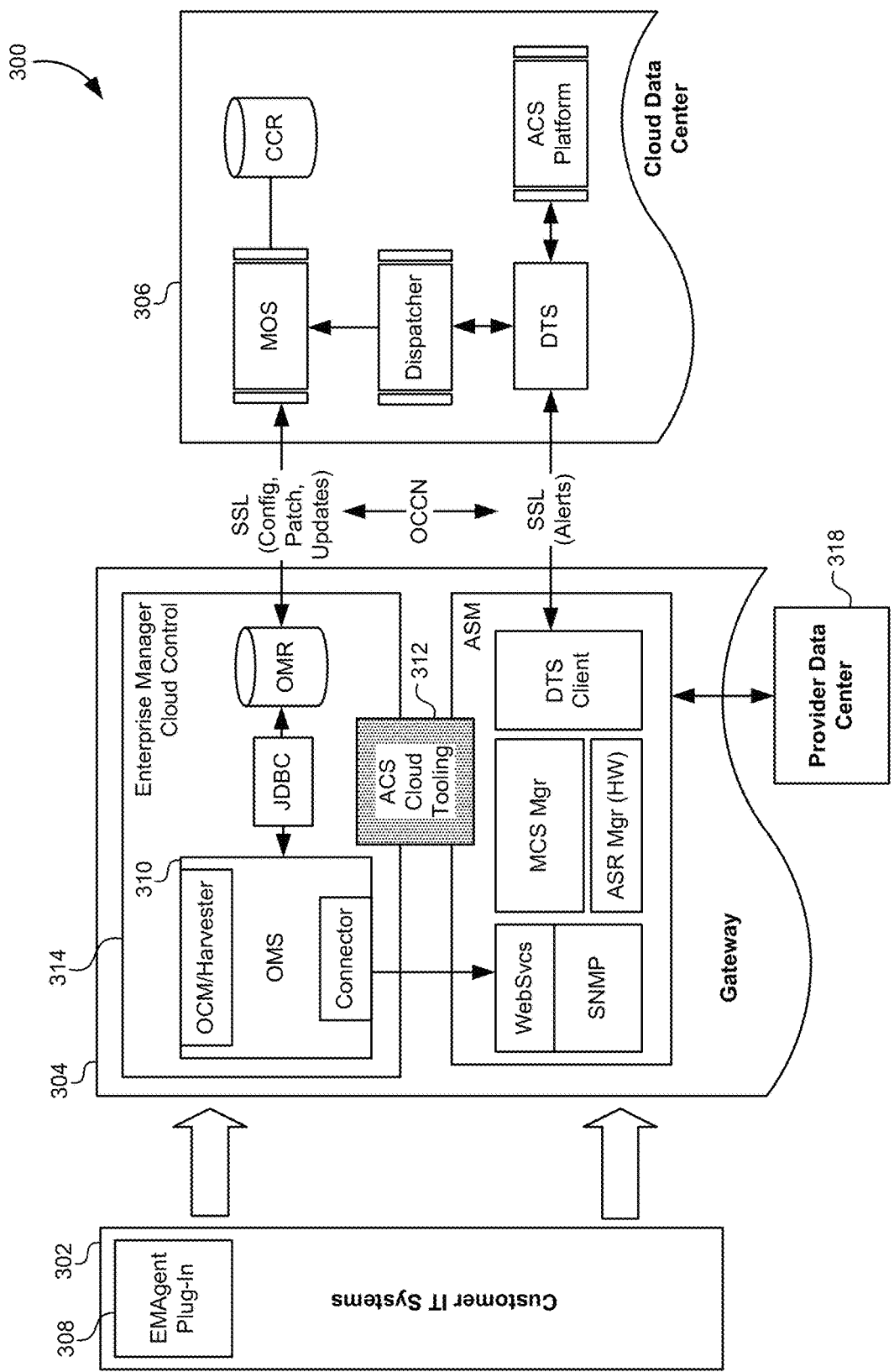
FIG. 3 illustrates a diagram of an architecture for implementing a database modeling and analytics service, according to one embodiment.

FIG. 3 illustrates a diagram of an architecture for implementing a database modeling and analytics service, according to one embodiment. The modeling and analytics service may be designed to help customers and their business teams to perform, for example, a workload mapping exercise to achieve the most efficient and cost-effective use of their targeted migration environment without reducing their existing capabilities. The modeling and analytics service may be performed using a customer's existing database estate as an input. For example, a customer IT system 302 may be used. The customer IT system 302 may include multiple environments such as development, test and production environments, databases, and/or the like. In many cases, databases in the customer IT system 302 may be implemented with legacy hardware that is no longer considered state-of-the-art or in a system that is no longer supported as a platform or as a current-supported software version.

In some embodiments, the modeling and analytics service may be designed to be proactive, in that it is performed during an assessment phase of a database consolidation process. The results of the modeling and analytics service may be used to plan the actual database consolidation and migration steps. For example, the modeling and analytics service may analyze development, test, and/or production systems prior to planning the actual database consolidation. One key benefit of this preemptive service is the ability to model and size databases scenarios that group similar system based on behaviors, configurations, and/or outputs. The grouping of similar systems may be done in accordance with a set of best practices as identified by the customer. By performing this analysis in advance of the actual database consolidation process, this assessment phase may greatly reduce the risk of rising costs to resolve migration problems.

In order to collect performance data, an agent 308 may be deployed on the customer IT system 302. For example, an Enterprise Manager Agent may be installed as a collector that gathers information in response to detected events, such as a database going off line. These agents may be and configured to provide performance data to an Enterprise Manager 314. The collected data may be selected so as to provide relevant database metrics for the modeling process described below. For example, the agent 308 may be focused on capturing a production workload for a selection of databases such that they can be mapped to a destination environment on a newer, more efficient platform.

The agent 308 may send performance data collected from the customer IT system 302 to a gateway 304. In some embodiments, the collected data may be sent to the Enterprise Manager Cloud Control 314 that resides within the gateway. The gateway 304 may be configured to operate on a customer system as a control point for managing how internal users and/or application assets are exposed to outside systems. The gateway 304 may provide access security, data security, auditing and monitoring capabilities, and integration with external systems. In one embodiment, the gateway 304 may provide access to a provider data center 318 and a cloud data center 306 that is remotely located away from the customer IT system 302. The cloud data center 306 may be operated by a provider of databases and software used by the customer IT system 302.

The gateway 304 may include a type of Enterprise Manager 314 that is configured to operate in conjunction with the cloud data center 306. A cloud tooling module 312 may operate with the enterprise manager 314 to extract and/or modify data that is already being collected by the enterprise manager 314 during normal operations. The data collected and/or modified by the cloud tooling module 312 may be selected as being relevant to modeling database operations. These data may then be provided to the cloud data center 306 for processing. In some embodiments, the gateway 304 may operate in a manner that is transparent to the customer. Data for use in database modeling may be collected in the background during normal operations and stored at the provider data center 318.

Figure 4:
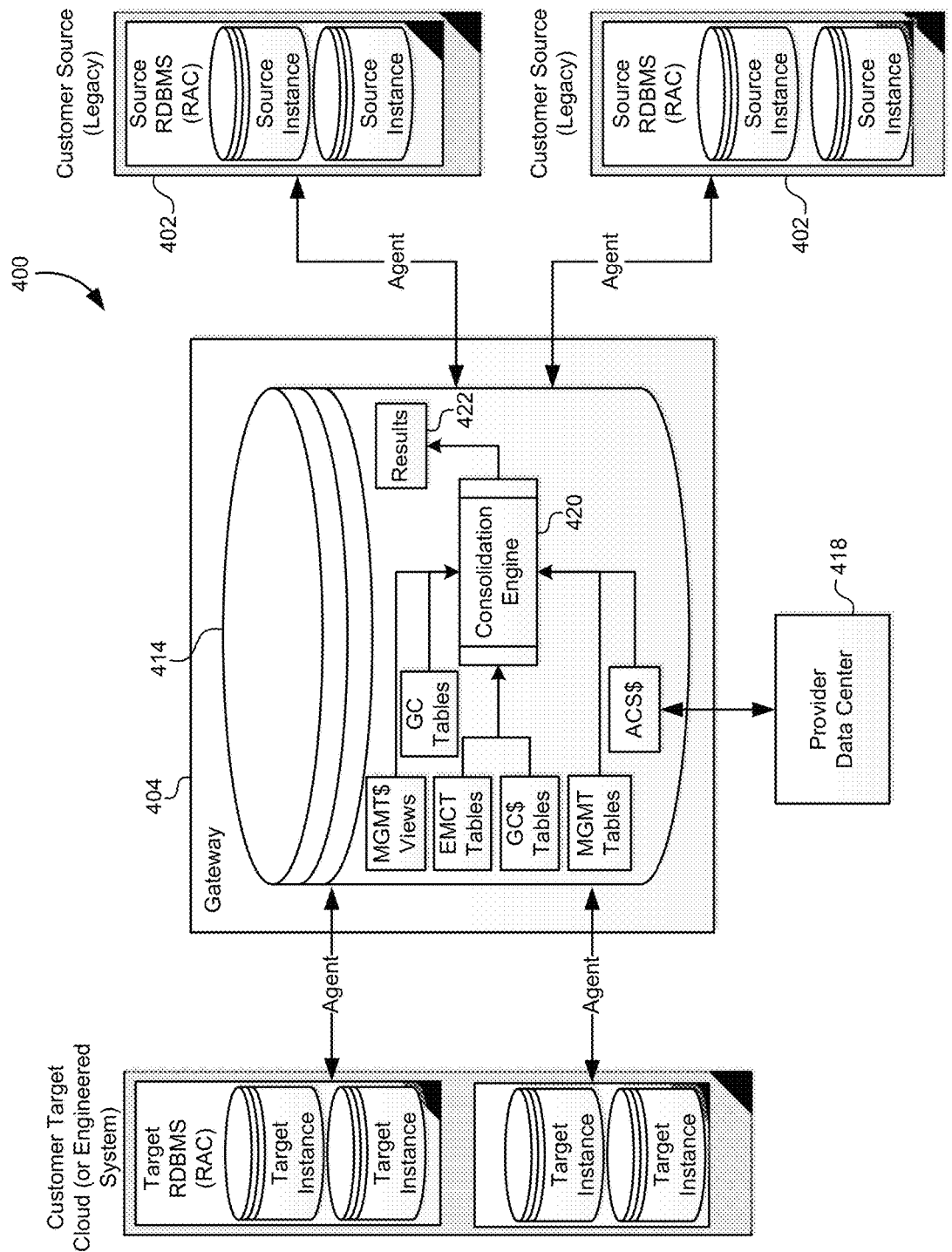
FIG. 4 illustrates a block diagram of a data storage architecture for modeling the migration of databases, according to some embodiments.

FIG. 4 illustrates a block diagram of a data storage architecture for modeling the migration of databases, according to some embodiments. As described above, the gateway 404 may operate in an Enterprise Manager to record data that are relevant to database migration and modeling during normal operations. The gateway 404 may include a data store 414 that is configured to store information associated with the performance of a set of legacy systems 402. The legacy systems 402 may include a large number of databases that are operated using a relational database management system (RDBMS). An agent installed on the legacy systems 402 may provide information to the gateway 404 that is stored in the data store 414. In some embodiments, the data store 414 may be populated continuously with data during normal operations of the legacy systems 402.

A special consolidation engine 420 may read information from various tables in the data store 414, such as management tables, garbage collection tables, read/write logs, and/or the like. Note that this allows the consolidation engine 422 have historical performance data always on hand. Therefore, when a customer creates a migration scenario, the migration scenario can be modeled using historical data rather than needing to collect future data in order to complete the analysis. For example, data retrieved from the "MGMT$" tables can be crunched via the consolidation engine 420, and the results may be stored in 422 ready to be shipped back to the provider data center 418.

Figure 5:
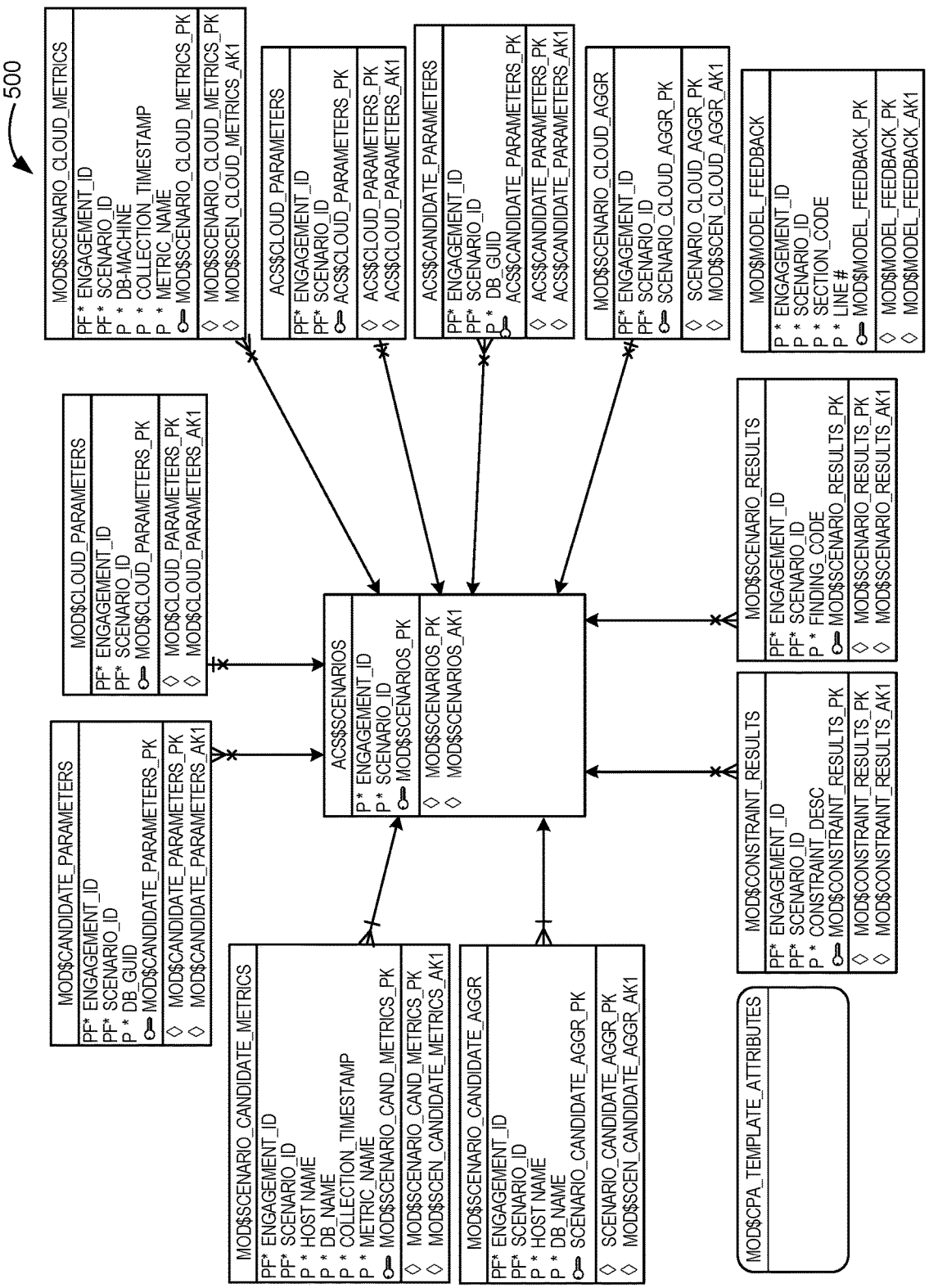
FIG. 5 illustrates a diagram of one exemplary data model, according to some embodiments.

The consolidation engine 420 may extract the data from existing tables and fit the data into a new data model. In some embodiments, as the Enterprise Manager populates tables in the data store 414, the consolidation engine 420 may detect the changes and automatically use the data to populate the new data model. In some embodiments, the consolidation engine 420 may instead wait until a migration scenario is provided by a user before translating data from the old format into the new data model. The new data model may include data from many different databases within the data store 414. FIG. 5 illustrates a diagram 500 of one exemplary data model, according to some embodiments. One having skill in the art would understand that many different types of data models may be used according to the needs of each particular implementation. This particular data model includes entries specifically for modeling migration scenarios, including scenario definitions, candidate target system parameters, and scenario results. This data model may be expanded and/or altered as necessary for particular embodiments. Therefore, it will be understood that diagram 500 is merely exemplary and not meant to be limiting.

Figure 6:
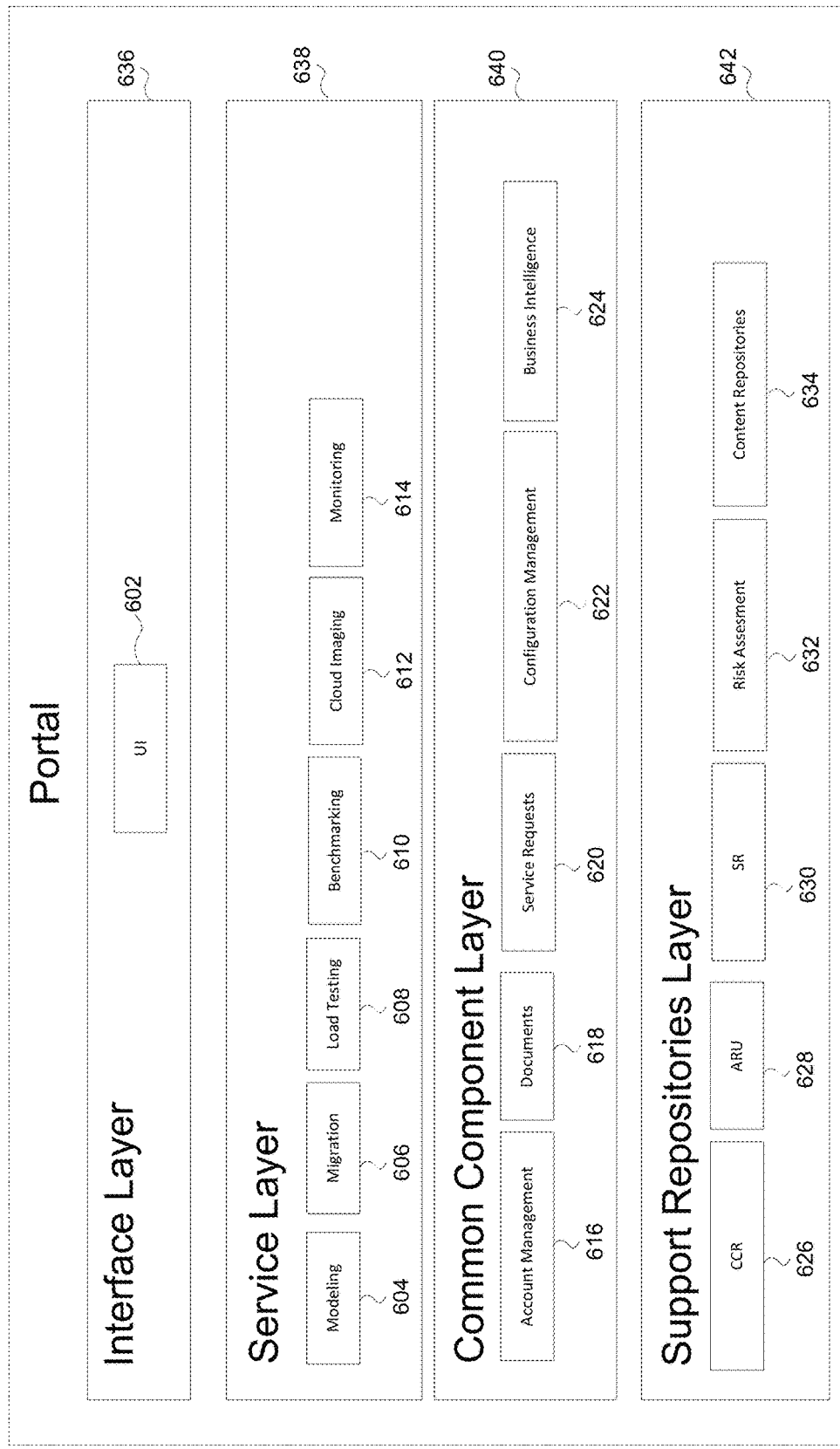
FIG. 6 illustrates a block diagram of the structure of a portal, according to some embodiments.

FIG. 6 illustrates a block diagram of the structure of a portal 600. The portal 600 may be based on a layered architecture. The portal may be divided into four layers: the interface layer 636, service layer 638, common component layer 640, and a support repositories layer 642. These layers may be responsible for the handling of service and customer information and the presentation and orchestration of services on the server side. The layers may be used to interface and communicate with the gateway residing and operating on the customer systems, enable remote administrators to interact with data and gateway to deliver service, and/or enable customers to receive service via portal and collaborate with service provider.

The backend of the portal may include a support repositories layer 642. The support repositories layer 642 may be used to leverage various sources of data to enrich and or deliver services. The support repositories layer 642 may include repositories or access to repositories that may include configuration, patch, SR information and data, and the like.

The backend of the portal may further include a common component layer 640. Elements of the layer 640 may include components that are used in support of services during and after deployment. Elements may include an account management module 616 that provides authentication and authorization and security to the portal and the service. Customers may be provided access to the portal, and also granted access/entitlement to one or more services. The layer 640 may further include a documents module 618 which provides the methods for managing documents using the portal. Furthermore the layer 640 includes a service request module for managing the various requests and steps used in the delivery of a service. A configuration management module 622 may be used to manage the configurations associated with a customer and service engagements. A business intelligence module 624 may be used to identify high value information.

The service layer 638 of the portal 600 may include specific modules and functions required for each service.

Each type of service may include defined workflow and logic, security, and/or the like. Each type of service may include a module for managing the special workflow, logic and other requirements for the service. Modules for modeling 604, migration 606, load testing 608, benchmarking 610, cloud imaging 612, monitoring 614 may be implemented in the layer 638.

Finally, the interface layer 636 of the portal 600 provides an interface such as a graphical user interface 602 that may be used by the customer, service provider, and or administrator. The interface layer represents the presentation layer for the services. The user interface 602 of the interface layer 636 may be a responsive web design and, as such, may work on multiple devices (e.g.: desktop, smart phone, tablet). The UI of the portal may provide a common service interface for the services and/or content. The UI may represent and present available, installed, active, and/or like support cloud services in a consistent interface with a similar look and feel. Common user interface components may be used. Navigation methodology may be based on rich service summary reporting with drill-down for more detail. Services may be tightly coupled with customer configurations. Technical data required for service delivery (analysis, verification, reporting) may be collected automatically. Analytics may be used extensively to help reduce the information overload by creating 'easy to consume' dashboards and reports.

Figure 7:
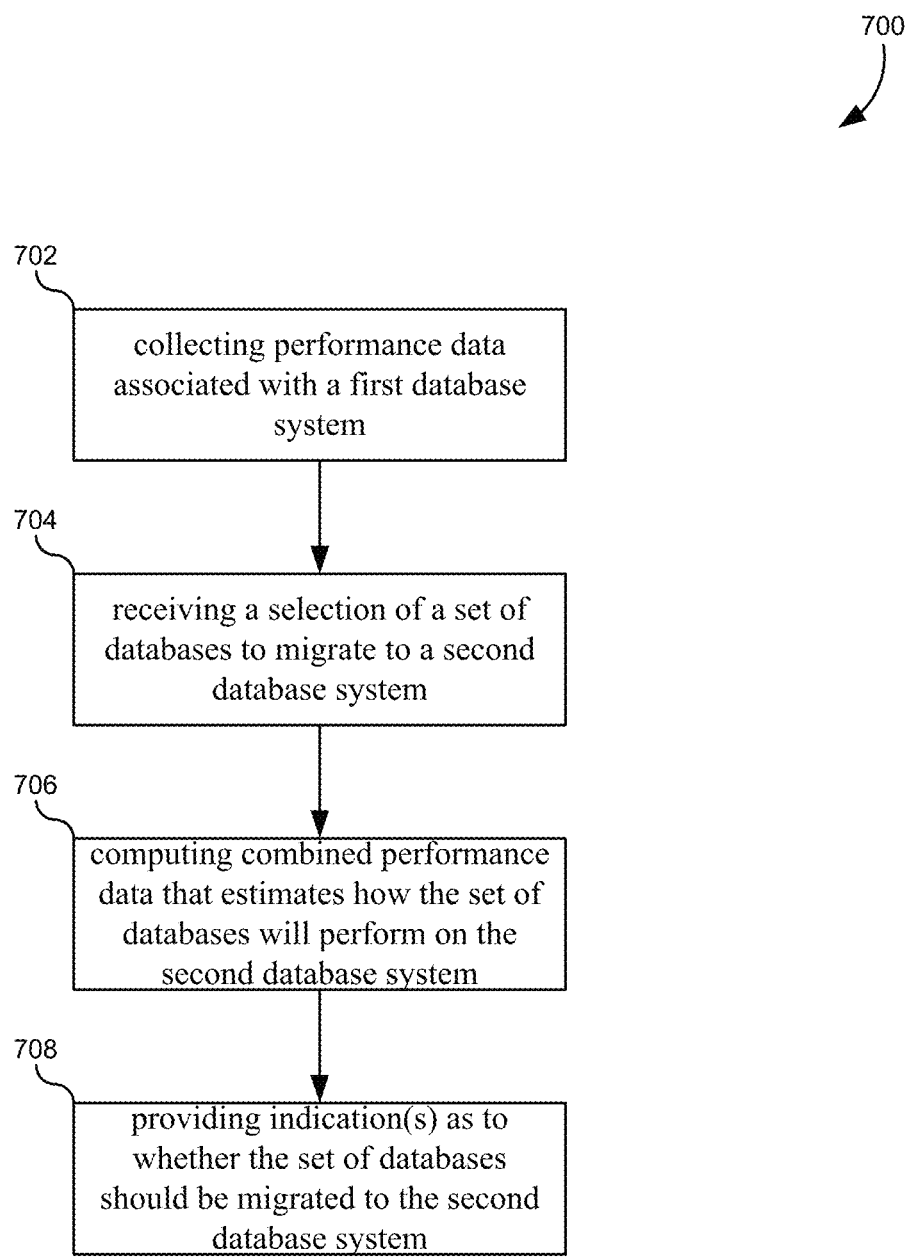
FIG. 7 illustrates a flowchart of a method of modeling perspective database migration between database systems, according to some embodiments.

FIG. 7 illustrates a flowchart 700 of a method of modeling perspective database migration between database systems, according to some embodiments. The method may include collecting performance data associated with a first database system (702). The first database system may be comprised of a plurality of individual databases. The first database system may be operated by a customer of a provider of the database, and the first database system may also be referred to as a legacy system. The first database system may comprise multiple individual databases, RDMSs, and database systems.

The performance data may be collected by a database agent installed on the first database system. The database agent may be configured to collect performance data that is relevant to database migration. Performance data may comprise different departments that use a database, a version of the database, information types stored within the database, number of reads/writes on a database, memory usage, CPU usage, size of the database, encryption method used, compression method used, security requirements, user groups, a status designating the criticality of a database, acceptable downtimes, and/or other similar types of information. In some embodiments, the term performance data may also include data related to databased behavior and/or configurations.

The performance data may be collected during the normal course of operations of the first database system. The performance data may be collected by an Enterprise Manager and stored locally in a data store belonging to the customer. In some embodiments, the performance data may be collected from existing tables that are utilized by the Enterprise Manager. These existing tables may utilize a first schema or data format that is compatible with a relational database manager of the first database system. In some embodiments, the performance data may be transformed into a second schema or format that is used to model database migration scenarios.

The performance data collection may be carried out by a gateway that operates transparently on the customer system. The gateway may be communicatively coupled through the Internet to a cloud-based service that is remotely located geographically away from the first database system. In some embodiments, the gateway may periodically transmit the performance data to the cloud-based service for performance analysis and diagnostic purposes.

Performance data may be collected over a time interval, then discarded as it becomes stale. For example, performance data may be collected for a time interval of approximately 1 weeks, 2 weeks, 3 weeks, 30 days, 60 days, 90 days, and/or the like. As the performance data becomes stale, it may be marked for deletion or garbage collection within the database and/or replaced by new performance data that is more recent.

The method may also include receiving a selection of a set of databases to migrate to a second database system (704). The second database system may selected by the customer as a target for database migration. For example, the first database system, or legacy system may be nearing the end of its useful life. The customer may wish to migrate data stored in the first database system into a new database system that is more state-of-the-art. Some embodiments may allow a customer to design the second database system from available components. For example, a customer may be presented with an interface that allows them to select hardware and/or software (such as an Exedata machine commercially available from Oracle®) and configured the selected hardware and/or software as desired for the second database system. This may allow users to model various migration scenarios using different hardware and/or software platforms before purchasing or making other agreements associated with the second database system.

In some embodiments, the portal described in relation to FIG. 6 may be used to select or design a configuration for the second database system. An operator of the cloud-based service and/or the portal may provide options for the second database system through the portal. This may allow an entity to leverage the service of modeling perspective database migrations in order to sell hardware and software configurations for the second database system as the target of the migration.

The selection of the set of databases may be from a plurality of databases within the first database system. In some cases, the set of databases may be a proper subset of the plurality of databases in the first database system, i.e. only some of the plurality of databases in the first database system may be selected for migration. Similar to the process described above for selecting the second database system, a portal may provide an interface through which a customer may select the set of databases from their existing legacy systems. For example, the portal may display current databases available for selection and allow a user to select one or more databases for migration.

In some embodiments, the set of databases selected for migration will include more than one database, and the migration scenario may involve migrating these databases to a single database within the second database system. For example, two or three legacy database systems may be migrated to a single target database. The target database may be equipped with more processing power, more storage space, and/or more advanced management software and algorithms that enable it to facilitate the data and operations of multiple legacy databases.

The method may further include computing combined performance data that estimates how the set of databases will perform on the second database system (706). The combined performance data may be computed by the gateway on the customer's computing system. In other embodiments, the combined performance data may be computed remotely at a cloud-based service. For instance, after selecting the set of databases and the second database system configuration in the portal of FIG. 6, the portal may receive information from the customer's gateway needed to compute the combined performance data.

In some cases, the combined performance data may simply combine the performance data from each of the set of databases into an aggregate total. For example, combined performance data representing memory usage may comprise an aggregated total of the memory usage of each of the set of databases selected for migration. In another example, combined performance data representing usage (reads/writes) may also be an aggregate total of the usage from each of the set of databases selected for migration.

In other cases, the combined performance data may instead take advantage of synergies, redundancies, and/or other advantages that may be realized by combining data stored in the set of databases selected for migration. For example, the combination may eliminate redundant data and thereby reduce the total memory usage of the combined performance data. In another example, the combination may provide a greater yield for compression algorithms, thereby also reducing the combined memory usage.

It will be understood that the combined performance data may comprise information types other than raw metrics. For example, the combined performance data may include a designation that resolves the individual designations assigned to each of the set of databases selected for migration. For example, each of the set of databases may have a security designation associated with a set of security procedures and/or requirements. The combined performance data may comprise a security designation derived from the individual security designations from the source databases. Combining a high-security database with a low security database may result in a combined performance designation corresponding to high security.

In another example, the combined performance data may include a maximum amount of time during which the combined databases may be unavailable. This may be referred to as a recovery time objective. Each of the set of databases selected for migration may include a distinct recovery time objective set, for example, by contractual obligation. The combined performance data may utilize the minimum, maximum, average, and/or any other arithmetic combination of individual recovery time objectives from the source databases to formulate a combined recovery time objective.

In another example, the combined performance data may include a maintenance window designation. Each of the set of databases selected for migration may be assigned an individual maintenance window during which the database can be off-line for migration. If multiple databases have similar maintenance windows, then the combined performance data may include a designation that indicates no maintenance window would exist, indicating to the customer that migrating the set of databases to the second database system may require additional maintenance window scheduling.

In some embodiments, the performance data for one of the legacy databases may not be compatible with the performance data of another legacy database. For example, hardware for a first database may use a processor that is incompatible with the hardware a second database. Therefore, simply comparing processing times (often measured in reads/writes per second) may not be ideal. These embodiments may normalize performance data over the set of databases selected by for migration in order to generate the combined performance data. For example, standardizing benchmarks such as SPECint may be used to provide a normalized measure of computing power in the source databases as they would be combined in the target second database system.

The method may additionally include providing one or more indications as to whether the set of databases should be migrated to the second database system (708). The one or more indications in may presented in a fashion indicating that the databases can or cannot be merged. The one or more indications may communicate whether the set of databases should cohabitate on a single machine or set of database resources, such as an engineered system. The one or more indications may also be presented in a graphical format that assigns a percentage or intermediate designation indicating that the databases can be merged, but that additional issues need to be considered. For example, one embodiment may use a green/yellow/red indication system where yellow indicates that some of the combined performance data reveals areas of possible concern for the customer.

In some embodiments, the one or more indications may be presented as a list through the portal described above that presents different categories of the combined performance data and a migration score assigned to each. Generally, the one or more indications may be divided into a group of quantitative components and a group of qualitative components. The group of quantitative components can describe whether the computing hardware of the second database system can operate a combination of the set of databases selected for migration. These indications may be measured against a set of technical specifications or hardware capabilities of the second database system. For example, one indication may provide the total memory usage of the combined set of databases as well as the available memory of a target database along with an indicator as to whether or not the combined databases will fit on the target database. In another example, the processor usage of the combined databases may be compared to the available processing power of the target database along with an indicator as to whether or not the target database can handle the workload of the combined databases.

The group of qualitative components may indicate non-hardware/technical considerations in migrating the databases. For example, merging databases with different security requirements can be technically achieved by assigning the combined database the highest security level from the source databases; however, enhancing the security of some data may not be desirable for business reasons. There also may be business reasons for keeping data separate and segregating employee lists that have access to each physical database. Other qualitative components may include indications regarding maintenance windows, availability, data integrity and backup storage requirements, physical location requirements, compatibility with other legacy systems, and/or the like.

In some embodiments, the one or more indications may also include options that may be available to enable the migration or to minimize risks involved. For example, one of the indications may include a recommendation that the target database use compression, and that by doing so the combined source databases will physically fit on the target database. In another example, one of the indications may include a recommendation that maintenance windows be adjusted for one of the source databases. In another example, one of the indications may include a recommendation that the source databases perform a search for redundant data to be removed, and that by doing so the combined databases may physically fit on the target database.

It should be appreciated that the specific steps illustrated in FIG. 7 provide particular methods of modeling a migration scenario according to various embodiments of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

The examples described above are not meant to be an exhaustive list of the types of quantitative and qualitative indications that may be of interest in modeling the prospective migration of databases. What follows is a description of several interfaces that may be provided by the portal of FIG. 6. These interfaces may be used to walk a customer through a database migration modeling process and provide the indications described above such that the customer can make a decision as to whether or not the migration should proceed. Again, these interfaces are merely exemplary and not meant to be limiting.

Figure 8:
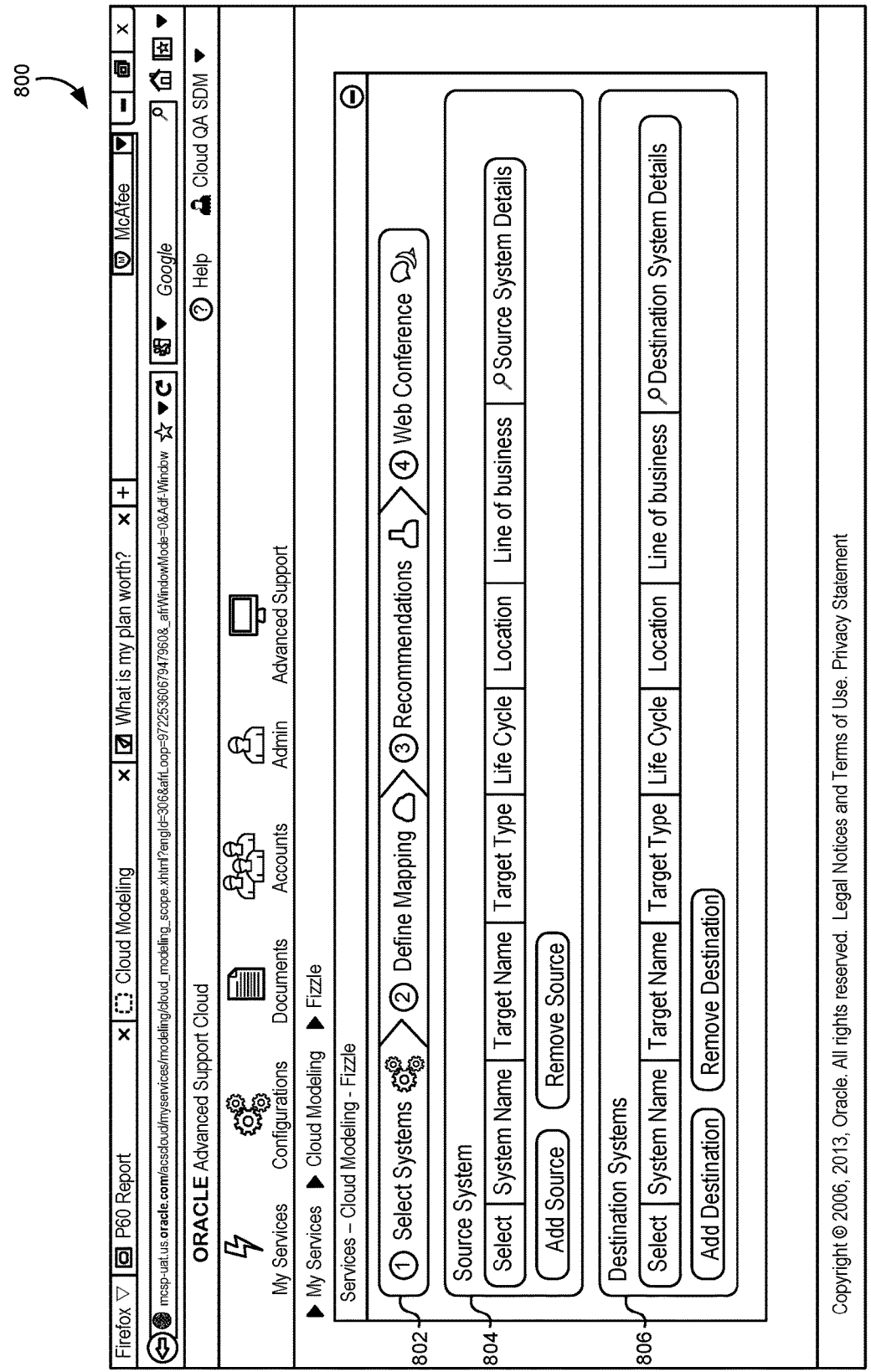
FIG. 8 illustrates an interface for selecting source and target databases, according to some embodiments.

FIG. 8 illustrates an interface 800 for selecting source and target databases, according to some embodiments. The interface 800 may be provided as a portal in a cloud support service as described above. Therefore, many services may be offered through the portal in addition to modeling database migration scenarios. Various services may be offered through a menu of interface 800, and "cloud modeling" may be selected from among the available services. This selection may instruct the portal to retrieve performance data stored locally on the customer system by the gateway and to calculate combined performance data to be displayed through the portal for the customer to analyze.

Interface 800 may include a progress bar 802 that allows the user to see their progress made in relation to the entire modeling process. An initial step in the modeling process may be to select source and destination systems. A source selection control 804 may be used to add and remove sources from the set of databases selected for migration. Clicking the "Add Source" button may allow the customer to select existing systems that are registered through the portal. Similarly, a destination selection control 806 may allow customer to add or remove destination hardware and/or software for the modeling process. For example, a user may select an engineered hardware system operated remotely via a cloud service. One or more legacy databases may be added as sources for data migration to a cloud-based storage service.

Figure 9:
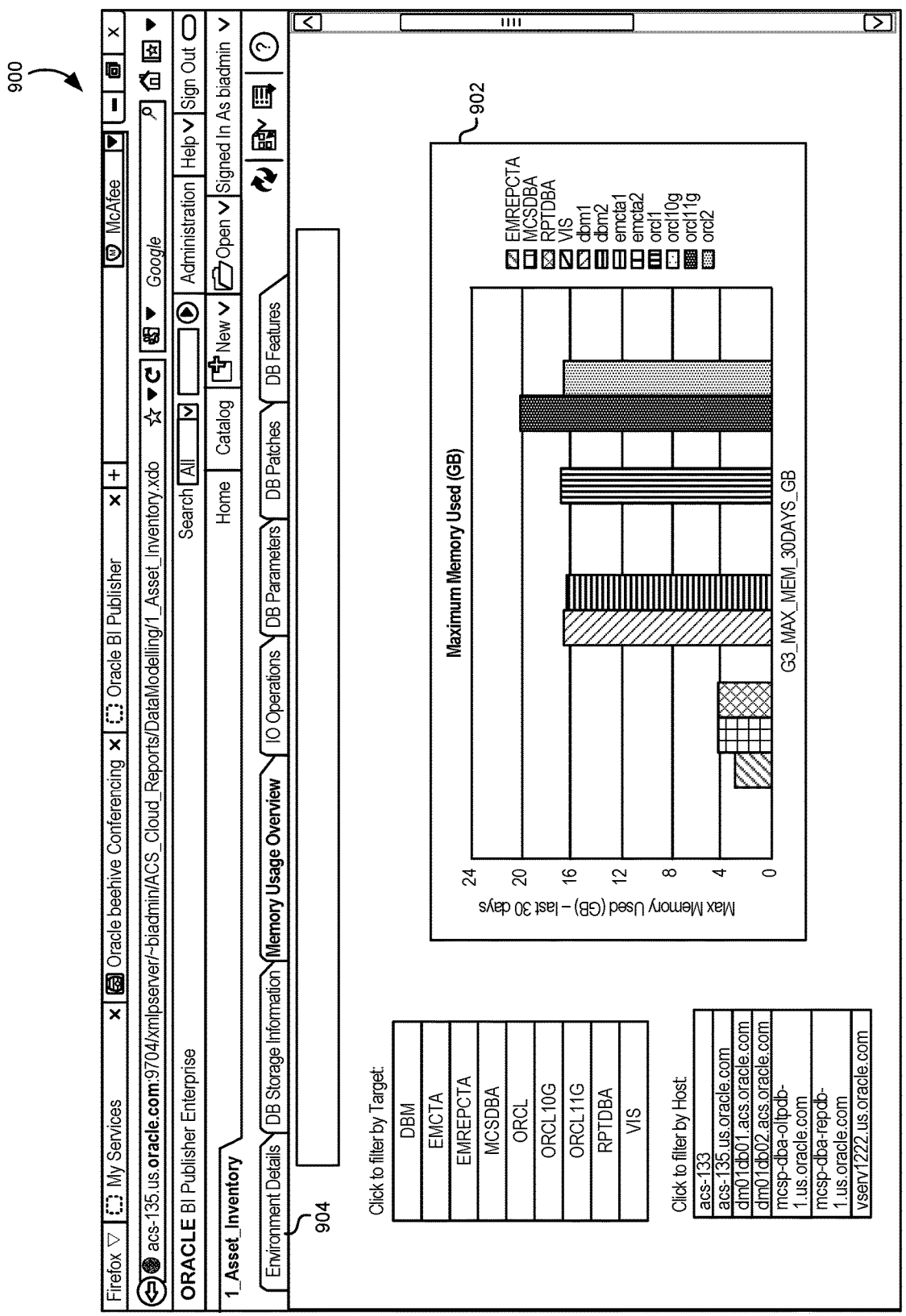
FIG. 9 illustrates an interface for analyzing the memory usage of a set of databases selected for migration, according to some embodiments.

After selecting source and destination databases, the portal may next allow a customer to view and analyze the performance data that is associated with the source databases. FIG. 9 illustrates an interface 900 for analyzing the memory usage of a set of databases selected for migration, according to some embodiments. Interface 900 includes a graph 902 that shows the relative memory usage over the last 30 days of various selected databases. This type of interface may allow a user to determine which databases should be added and removed from the selection. For example, interface 900 may reveal that one very large database is included in the selection. The customer may remove the large database in order to fit more smaller databases in the target system.

Memory usage is but one example of the performance data that may be viewed for the set of databases selected for migration. A menu 904 may allow the customer to select other types of performance data for the source databases. For example, environmental details, database storage information, database features, and/or other performance data may also be provided through interface 900. The customer may select the tab associated with a desired set of performance data in order to view it through the portal.

Figure 10:
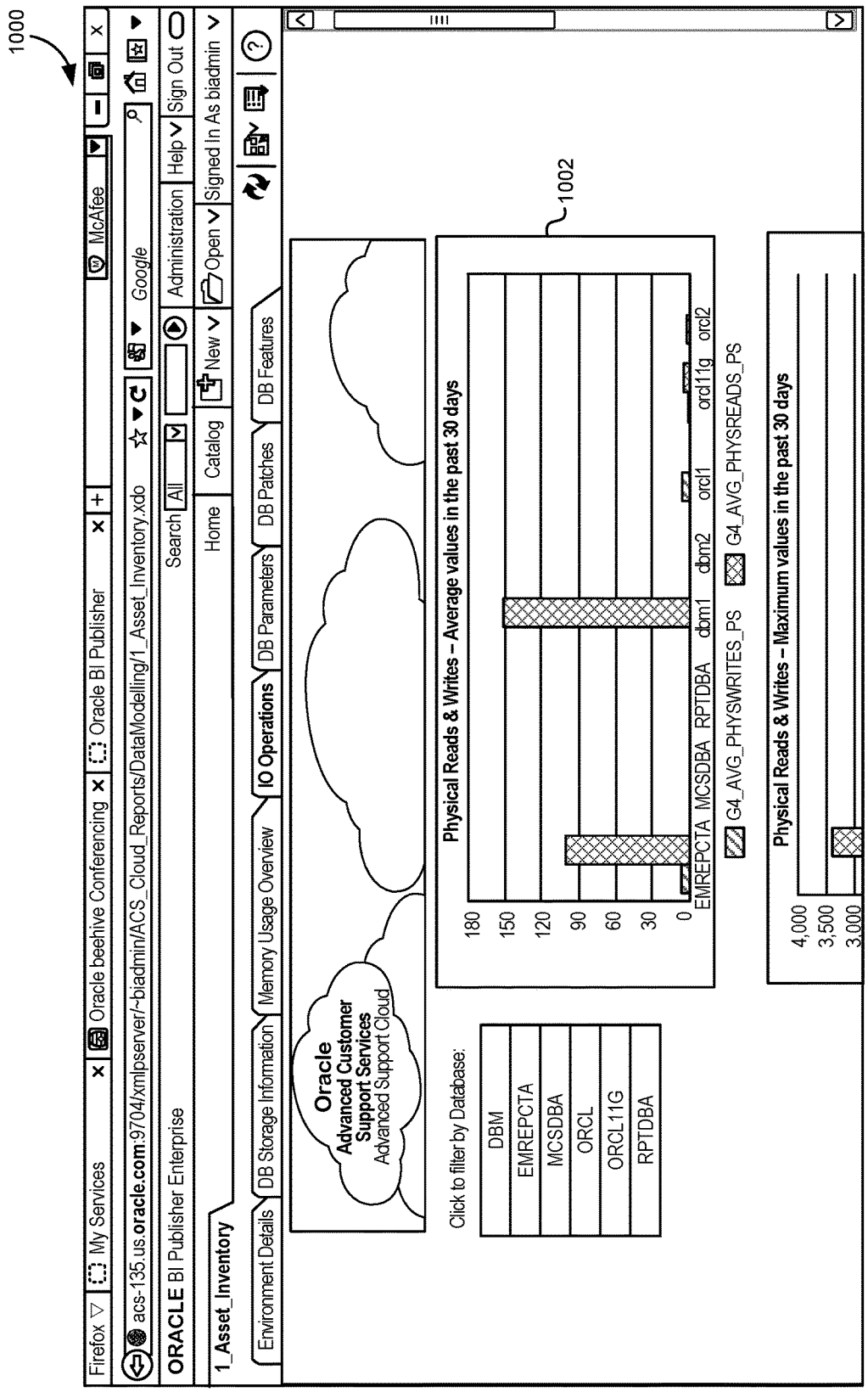
FIG. 10 illustrates an interface for analyzing the I/O operations of the set of databases selected for migration, according to some embodiments.

FIG. 10 illustrates an interface 1000 for analyzing the I/O operations of the set of databases selected for migration, according to some embodiments. As with memory usage, interface 1000 may be available through one of the tabs at the top of interface 1000. A graph 1002 may display the average number of physical reads and/or writes over a particular time interval, such as the past 30 days. Other types of graphs may show maximum values, minimum values, and/or other arithmetic measures of database reads and/or writes.

Figure 11:
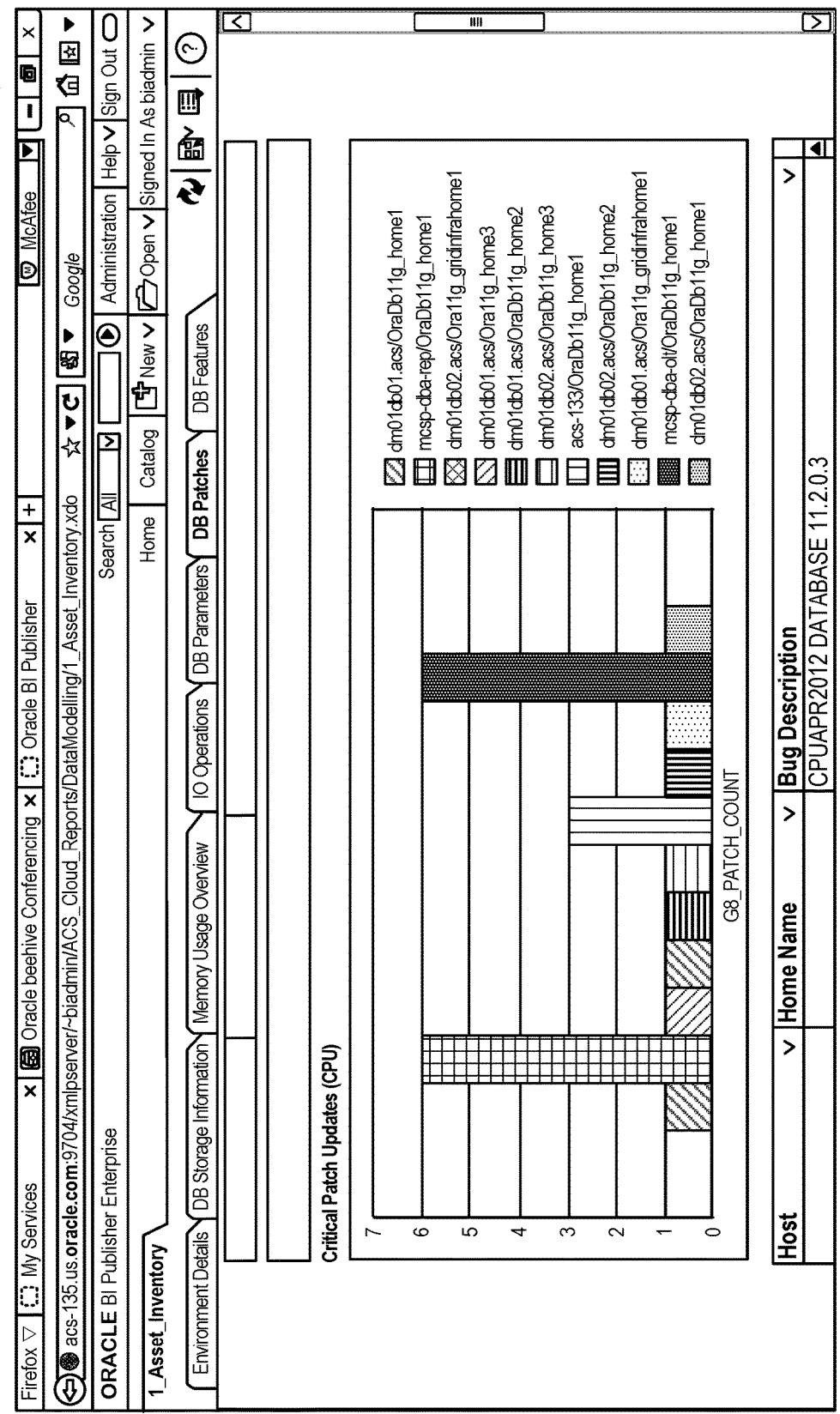
FIG. 11 illustrates an interface for analyzing the number of patches applied to the set of databases selected for migration, according to some embodiments.

FIG. 11 illustrates an interface 1100 for analyzing the number of patches applied to the set of databases selected for migration, according to some embodiments. Interface 1100 may include a graph 1102 that illustrates the relative number of critical patches applied to each of the databases in the set. This information may help customers group databases with similar patch counts together for migration to the same target database. Patch numbers may be correlated with an amount of maintenance required by each database, and it may be advantageous to group databases that require similar amounts of maintenance.

Interface 900, interface 1000, and interface 1100 may all be used by the customer to analyze the performance data associated with each of the set of databases selected for migration. The set of databases selected for migration, as well as the target database or second database system, may be collectively referred to as a migration scenario or a migration configuration. After viewing the performance data for the source databases, the cloud-based portal may next provide interfaces for analyzing the combined performance data for a particular migration scenario to the target database.

Figure 12:
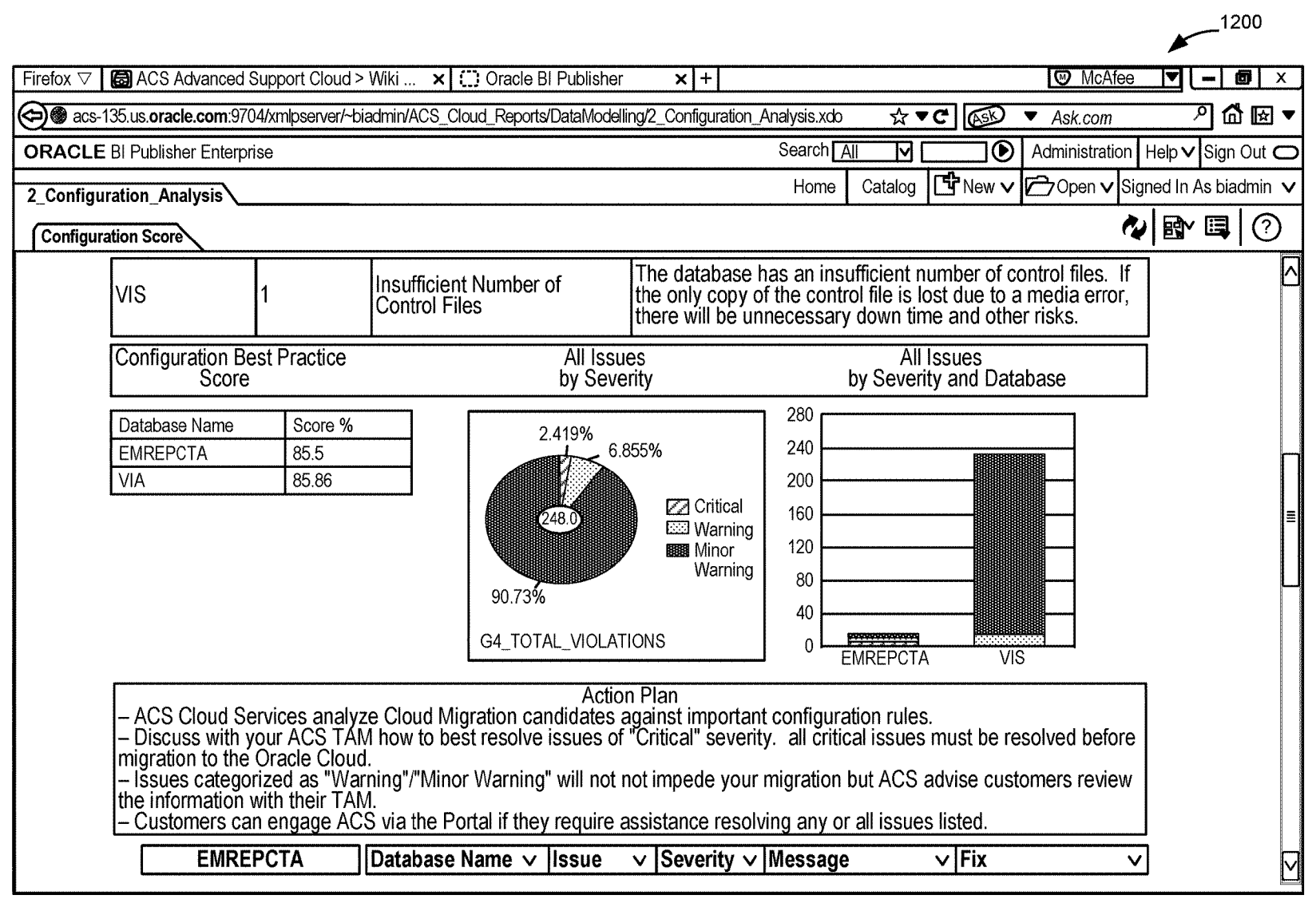

FIG. 12 illustrates an interface 1200 for configuration analysis, according to some embodiments. Interface 1200 allows a user to determine if a system is configured in such a way that it would cause an issue for migration to the second database system. Various graphs, charts, tables, and other graphical elements may display critical issues, the severity of the issues, the number of issues, scores, compliance with business rules and other technical requirements, and/or the like. Interface 1200 may provide an overview for the customer to quickly analyze a migration scenario. From interface 1200, a customer may delve into the specific details of the combined performance data.

Figure 13:
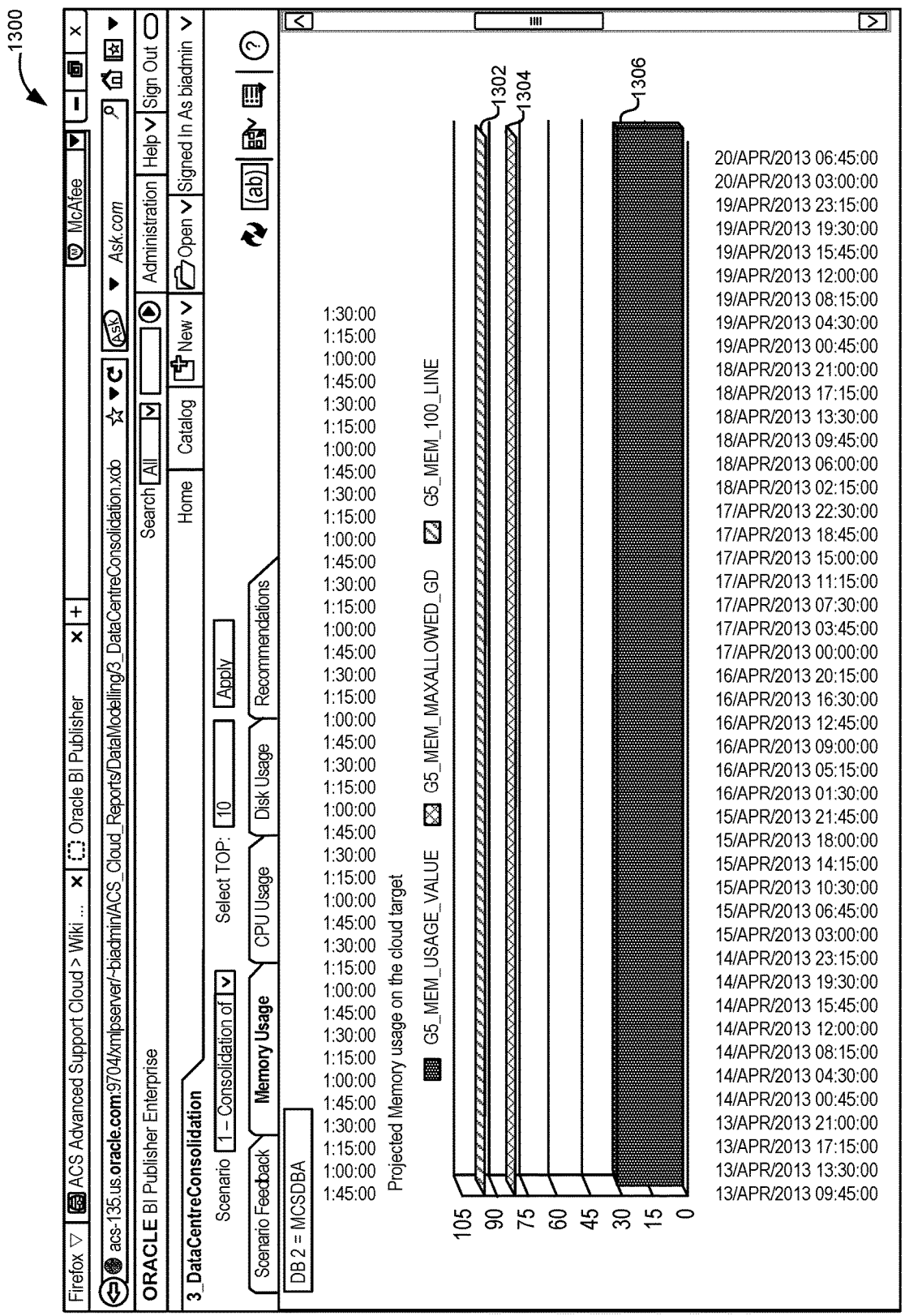
FIG. 13 illustrates an interface for analyzing memory usage on a target database system, according to some embodiments.

FIG. 13 illustrates an interface 1300 for analyzing memory usage on a target database system, according to some embodiments. The graph of interface 1300 illustrates the combined memory usage 1306 for two source databases after migration to the target database. Multiple thresholds may be used for evaluation. Threshold 1302 may be considered a hard threshold that memory usage is not allowed to exceed (100% in this case). Threshold 1304 may be considered a soft threshold indicating a desired maximum level of memory usage.

In the example illustrated by interface 1300, the combined memory usage 1306 does not exceed either threshold 1302 or threshold 1304. In some embodiments, if peak values of memory usage exceed threshold 1304, then a warning (e.g.

yellow) may be presented in the one or more indications of whether the databases should be combined. Similarly, if the average value of memory usage exceeds a threshold 1304, then a critical error (e.g. red) may be presented in the one or more indications. In some embodiments, when the warning is indicated by a yellow color and a critical error is indicated by a red color, then no error may be indicated by a green color.

Figure 14:
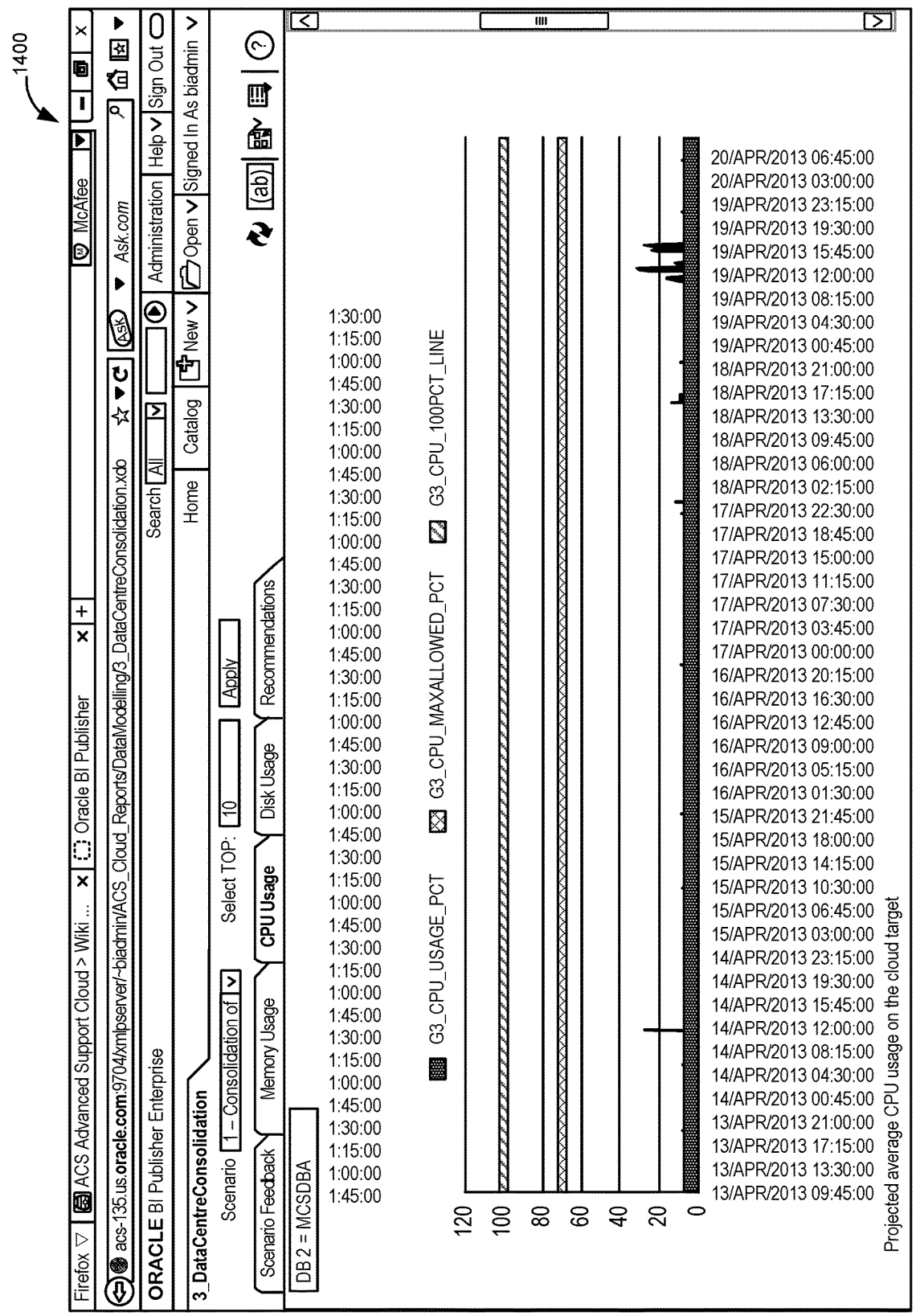
FIG. 14 illustrates an interface for analyzing CPU usage on a target database system, according to some embodiments.

FIG. 14 illustrates an interface 1400 for analyzing CPU usage on a target database system, according to some embodiments. Interface 1400 may be very similar to interface 1300. Both hard and soft thresholds may be used, and neither the peak value nor the average value of the CPU usage of the combined systems on the target database exceed the soft threshold. Warnings may be given for the values that exceed the soft threshold, and critical errors may be triggered for average values that exceed the soft threshold.

Figure 15:
FIG. 15 illustrates an interface for recommending whether a migration scenario should be carried out, according to some embodiments.

FIG. 15 illustrates an interface 1500 for recommending whether a migration scenario should be carried out, according to some embodiments. The customer may be informed that the modeling exercise is completed. The customer may also be given a pass/fail/warning status of the modeling exercise. In this embodiment, each assessment category (disk projections, memory projections, CPU projections, disk usage, database features, etc.) has passed and is labeled with a green color. Therefore, the overall status of the modeling exercise is "PASS." Interface 1500 allows user to quickly make a determination about a migration scenario without needing to delve into the specifics of each assessment category.

FIG. 16 illustrates an interface 1600 for providing recommendations for a migration scenario, according to some embodiments. Recommendations may be provided such that the performance of the target database will be improved. In cases where the migration scenario provided indications of critical errors or warnings, recommendations may be provided in order to mitigate the critical errors and/or warnings. In the example of interface 1600, a recommendation may inform the customer that data compression may improve the performance of one or more target databases.

In the foregoing description, interfaces were described covering certain aspects of a database modeling service. It should be noted that other aspects of the modeling service may be provided in other interfaces that have not been described explicitly. For example, an interface may describe security reports related to a set of databases selected for migration. Another interface might describe the availability of the set of databases. Another interface might describe data integrity or "Data Guard" aspects of the set of databases. Therefore, the interfaces presented herein are merely exemplary, and not meant to be limiting.

In the foregoing description, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A method of modeling a prospective database migration between database systems, the method comprising:
 deploying a plurality of software agents onto a first database system to collect operating data from a plurality of databases in the first database system during normal operations, wherein the plurality of software agents are deployed and collect the operating data prior to receiving a request to analyze migration of a set of databases in the plurality of databases to a second database system;
 receiving the request to analyze migration of the set of databases in the plurality of databases to the second database system;
 identifying and extracting, through a gateway operating on the first database system, performance data relevant to migrating the set of databases to the second database system, wherein the performance data is extracted from the operating data that was collected by the plurality of software agents during normal operations, where the gateway provides access and access security to the second database system and provides services to migrate the set of databases from the first database system to the second database system;
 computing, using at least some of the performance data, combined performance data that estimates how the set of databases will perform on a configuration of the second database system, the combined performance data including one or more maintenance window designations assigned to one or more databases of the set of databases;
 providing, to the first database system through a portal of a cloud service and through the gateway, one or more indications as to whether the set of databases should be migrated to the configuration of the second database system, wherein the one or more indications are based on the combined performance data, including the maintenance window designations, and the one or more indications as to whether the set of databases should be migrated comprise a recommendation based on scheduling of one or more maintenance windows corresponding to at least part of the set of databases;
 identifying a difference in security levels of a first database and a second database in the set of databases, where the first database is identified as having a first security level corresponding to a first set of security requirements, and the second database is identified as having a second security level that is different from the first security level, the second security level corresponding to a second set of security requirements that is different from the first set of security requirements;
 resolving the difference in the security levels at least in part by combining the first database with the second database when the first database and the second database are migrated to a third database so that the third database is established with the first security level or the second security level so that only the first set of security requirements or only the second set of security requirements is retained with the third database;
 generating, by a remote system, a migration plan based at least in part on the recommendation and the resolving the difference in the security levels, and generating, by the remote system, one or more migration scripts to execute in accordance with the migration plan to combine the first database with the second database and migrate the first database and the second database to the third database so that the third database is established with the first security level or the second security level; and causing, by the gateway and with the provided access and the provided access security, execution of the one or more migration scripts in accordance with the migration plan.

2. The method of claim 1, wherein:

the performance data is collected by a database agent operating on the first database system; and the combined performance data is computed at a cloud-based service operated by a provider of the second database system.

3. The method of claim 1, wherein the set of databases comprises more than one database, and wherein the more than one database is to be migrated to a single database in the second database system.

4. The method of claim 1, wherein the one or more indications comprises:

a quantitative component that describes whether computing hardware of the second database system can facilitate the set of databases according to a set of technical specifications; and a qualitative component that describes whether the set of databases can operate together on the second database system according to a set of business rules.

5. The method of claim 1, wherein the one or more indications comprises one or more selections from the group consisting of:

a first indication that an average performance of a combination of the set of databases exceeds a threshold;

a second indication that a peak performance of the combination of the set of databases exceeds the threshold; and a third indication that neither the peak performance and the average performance exceeds a threshold.

6. The method of claim 1, wherein the cloud service is operated by a provider of the second database system.

7. The method of claim 1, further comprising translating the performance data from a first schema to a second schema, wherein:

the first schema is used by a relational database manager of the first database system; and the second schema is used for the prospective database migration.

8. The method of claim 1, wherein the one or more indications comprises a combined storage space required by a combination of the set of databases in the second database system.

9. The method of claim 1, wherein the one or more indications comprises a combined processor workload required by a combination of the set of databases in the second database system.

10. The method of claim 1, where the resolving comprises establishing the third database with that security level selected from the first security level and the second security level which is higher.

11. A non-transitory, computer-readable memory comprising a sequence of instructions which, when executed by one or more processors, causes the one or more processors to model a prospective database migration between database systems by:

deploying a plurality of software agents onto a first database system to collect operating data from a plurality of databases in the first database system during normal operations, wherein the plurality of software agents are deployed and collect the operating data prior to receiving a request to analyze migration of a set of databases in the plurality of databases to a second database system;

receiving the request to analyze migration of the set of databases in the plurality of databases to the second database system;

identifying and extracting, through a gateway operating on the first database system, performance data relevant to migrating the set of databases to the second database system, wherein the performance data is extracted from the operating data that was collected by the plurality of software agents during normal operations, where the gateway provides access and access security to the second database system and provides services to migrate the set of databases from the first database system to the second database system;

computing, using at least some of the performance data, combined performance data that estimates how the set of databases will perform on a configuration of the second database system, the combined performance data including one or more maintenance window designations assigned to one or more databases of the set of databases;

providing, to the first database system through a portal of a cloud service and through the gateway, one or more indications as to whether the set of databases should be migrated to the configuration of the second database system, wherein the one or more indications are based on the combined performance data, including the maintenance window designations, and the one or more indications as to whether the set of databases should be migrated comprise a recommendation based on scheduling of one or more maintenance windows corresponding to at least part of the set of databases;

identifying a difference in security levels of a first database and a second database in the set of databases, where the first database is identified as having a first security level corresponding to a first set of security requirements, and the second database is identified as having a second security level that is different from the first security level, the second security level corresponding to a second set of security requirements that is different from the first set of security requirements;

resolving the difference in the security levels at least in part by combining the first database with the second database when the first database and the second database are migrated to a third database so that the third database is established with the first security level or the second security level so that only the first set of security requirements or only the second set of security requirements is retained with the third database;

generating a migration plan based at least in part on the recommendation and the resolving the difference in the security levels, and generating one or more migration scripts to execute in accordance with the migration plan to combine the first database with the second database and migrate the first database and the second database to the third database so that the third database is established with the first security level or the second security level; and causing, by the gateway and with the provided access and the provided access security, execution of the one or more migration scripts in accordance with the migration plan.

12. The non-transitory, computer-readable memory according to claim 11, wherein the one or more indications comprises:
　　a quantitative component that describes whether computing hardware of the second database system can facilitate the set of databases according to a set of technical specifications; and
　　a qualitative component that describes whether the set of databases can operate together on the second database system according to a set of business rules.

13. The non-transitory, computer-readable memory according to claim 11, wherein the one or more indications comprises one or more selections from the group consisting of:
　　a first indication that an average performance of a combination of the set of databases exceeds a threshold;
　　a second indication that a peak performance of the combination of the set of databases exceeds the threshold; and
　　a third indication that neither the peak performance and the average performance exceeds a threshold.

14. The non-transitory, computer-readable memory according to claim 11, wherein the cloud service is operated by a provider of the second database system.

15. A system comprising:
　　one or more processors; and
　　a memory communicatively coupled with and readable by the one or more processors and comprising a sequence of instructions which, when executed by the one or more processors, cause the one or more processors to model a prospective database migration between database systems by:
　　　　deploying a plurality of software agents onto a first database system to collect operating data from a plurality of databases in the first database system during normal operations, wherein the plurality of software agents are deployed and collect the operating data prior to receiving a request to analyze migration of a set of databases in the plurality of databases to a second database system;
　　　　receiving the request to analyze migration of the set of databases in the plurality of databases to the second database system;
　　　　identifying and extracting, through a gateway operating on the first database system, performance data relevant to migrating the set of databases to the second database system, wherein the performance data is extracted from the operating data that was collected by the plurality of software agents during normal operations, where the gateway provides access and access security to the second database system and provides services to migrate the set of databases from the first database system to the second database system;
　　　　computing, using at least some of the performance data, combined performance data that estimates how the set of databases will perform on a configuration of the second database system, the combined performance data including one or more maintenance window designations assigned to one or more databases of the set of databases;
　　　　providing, to the first database system through a portal of a cloud service and through the gateway, one or more indications as to whether the set of databases should be migrated to the configuration of the second database system, wherein the one or more indications are based on the combined performance data, including the maintenance window designations, and the one or more indications as to whether the set of databases should be migrated comprise a recommendation based on scheduling of one or more maintenance windows corresponding to at least part of the set of databases;
　　　　identifying a difference in security levels of a first database and a second database in the set of databases, where the first database is identified as having a first security level corresponding to a first set of security requirements, and the second database is identified as having a second security level that is different from the first security level, the second security level corresponding to a second set of security requirements that is different from the first set of security requirements;
　　　　resolving the difference in the security levels at least in part by combining the first database with the second database when the first database and the second database are migrated to a third database so that the third database is established with the first security level or the second security level so that only the first set of security requirements or only the second set of security requirements is retained with the third database;
　　　　generating a migration plan based at least in part on the recommendation and the resolving the difference in the security levels, and generating one or more migration scripts to execute in accordance with the migration plan to combine the first database with the second database and migrate the first database and the second database to the third database so that the third database is established with the first security level or the second security level; and
　　　　causing, by the gateway and with the provided access and the provided access security, execution of the one or more migration scripts in accordance with the migration plan.

16. The system of claim 15, wherein the one or more indications comprises:
　　a quantitative component that describes whether computing hardware of the second database system can facilitate the set of databases according to a set of technical specifications; and
　　a qualitative component that describes whether the set of databases can operate together on the second database system according to a set of business rules.

17. The system of claim 15, wherein the one or more indications comprises one or more selections from the group consisting of:
　　a first indication that an average performance of a combination of the set of databases exceeds a threshold;
　　a second indication that a peak performance of the combination of the set of databases exceeds the threshold; and
　　a third indication that neither the peak performance and the average performance exceeds a threshold.

18. The system of claim 15, wherein the cloud service is operated by a provider of the second database system.

19. The system of claim 15, wherein the set of databases comprises more than one database, and wherein the more than one database is to be migrated to a single database in the second database system.

\* \* \* \* \*

UNITED STATES PATENT AND TRADEMARK OFFICE
CERTIFICATE OF CORRECTION

PATENT NO. : 11,157,664 B2  
APPLICATION NO. : 13/937885  
DATED : October 26, 2021  
INVENTOR(S) : Higginson et al.

Page 1 of 1

It is certified that error appears in the above-identified patent and that said Letters Patent is hereby corrected as shown below:

On the Title Page

Column 2, under Abstract, Line 3, delete "plurality databases" and insert -- plurality of databases --, therefor.

On page 5, Column 2, under Other Publications, Line 27, delete "Internationai" and insert -- International --, therefor.

In the Specification

In Column 2, Line 2, delete "plurality databases" and insert -- plurality of databases --, therefor.

In Column 2, Line 67, delete "plurality databases" and insert -- plurality of databases --, therefor.

In Column 3, Line 21, delete "plurality databases" and insert -- plurality of databases --, therefor.

In Column 10, Line 44, delete "and or" and insert -- and/or --, therefor.

In Column 11, Line 10, delete "and or" and insert -- and/or --, therefor.

In Column 12, Line 24, delete "Exedata" and insert -- Exadata --, therefor.

Signed and Sealed this  
Twenty-ninth Day of March, 2022

Drew Hirshfeld  
*Performing the Functions and Duties of the*  
*Under Secretary of Commerce for Intellectual Property and*  
*Director of the United States Patent and Trademark Office*